(12) United States Patent
Kawashita et al.

(10) Patent No.: US 8,324,736 B2
(45) Date of Patent: Dec. 4, 2012

(54) MANUFACTURING PROCESS AND STRUCTURE OF THROUGH SILICON VIA

(75) Inventors: Michihiro Kawashita, Hitachinaka (JP); Yasuhiro Yoshimura, Kasumigaura (JP); Naotaka Tanaka, Kasumigaura (JP); Takahiro Naito, Kokubunji (JP); Takashi Akazawa, Musashimurayama (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/153,860

(22) Filed: Jun. 6, 2011

(65) Prior Publication Data

US 2011/0233773 A1    Sep. 29, 2011

Related U.S. Application Data

(63) Continuation of application No. 12/133,828, filed on Jun. 5, 2008, now Pat. No. 7,973,415.

(30) Foreign Application Priority Data

Jun. 6, 2007    (JP) ................................. 2007-150289

(51) Int. Cl.
*H01L 23/528* (2006.01)
(52) U.S. Cl. ................ 257/775; 257/687; 257/E23.008; 257/E23.011
(58) Field of Classification Search ................... 257/565, 257/575, 773, 774, 775, 786, E29.031, E29.034, 257/E29.112, E29.114, 684, 686, 698, E23.004, 257/E23.008, E23.01, E23.011
See application file for complete search history.

(56) References Cited

U.S. PATENT DOCUMENTS

| 7,151,009 | B2 | 12/2006 | Kim et al. |
| 7,291,929 | B2 | 11/2007 | Tanaka et al. |
| 7,655,504 | B2 | 2/2010 | Mashino |
| 2006/0038300 | A1* | 2/2006 | Tanida et al. ................. 257/773 |
| 2006/0076600 | A1 | 4/2006 | Nakabayashi et al. |
| 2006/0170112 | A1* | 8/2006 | Tanaka et al. ................. 257/777 |

FOREIGN PATENT DOCUMENTS

| JP | 11-204720 | 7/1999 |
| JP | 2000-260934 | 9/2000 |
| JP | 2005-093486 | 4/2005 |
| JP | 2005-340389 | 12/2005 |
| JP | 2006-032699 | 2/2006 |
| JP | 2006-114545 A | 4/2006 |
| JP | 2006-173476 A | 6/2006 |
| JP | 2006-210745 | 8/2006 |
| JP | 2006-222138 | 8/2006 |
| JP | 2006-286677 | 10/2006 |
| JP | 2007-053149 | 3/2007 |
| KR | 2003-0096006 A | 12/2003 |
| KR | 10-2005-0120280 A | 12/2005 |

* cited by examiner

*Primary Examiner* — Eduardo A Rodela
(74) *Attorney, Agent, or Firm* — Mattingly & Malur, PC

(57) ABSTRACT

A through silicon via reaching a pad from a second surface of a semiconductor substrate is formed. A penetration space in the through silicon via is formed of a first hole and a second hole with a diameter smaller than that of the first hole. The first hole is formed from the second surface of the semiconductor substrate to the middle of the interlayer insulating film. Further, the second hole reaching the pad from the bottom of the first hole is formed. Then, the interlayer insulating film formed on the first surface of the semiconductor substrate has a step shape reflecting a step difference between the bottom surface of the first hole and the first surface of the semiconductor substrate. More specifically, the thickness of the interlayer insulating film between the bottom surface of the first hole and the pad is smaller than that in other portions.

8 Claims, 22 Drawing Sheets

MANUFACTURING PROCESS AND STRUCTURE OF THROUGH SILICON VIA

CROSS-REFERENCE TO RELATED APPLICATION

This application is a continuation application of U.S. Ser. No. 12/133,828, filed Jun. 5, 2008 (now U.S. Pat. No. 7,973, 415), the entire disclosure of which is hereby incorporated by reference.

The present application claims priority from Japanese Patent Application No. JP 2007-150289 filed on Jun. 6, 2007, the content of which is hereby incorporated by reference into this application.

TECHNICAL FIELD OF THE INVENTION

The present invention relates to a semiconductor device and a manufacturing technology thereof. More particularly, it relates to a technology effectively applied to a semiconductor device having a plurality of semiconductor chips stacked three-dimensionally and a manufacturing technology of the semiconductor device.

BACKGROUND OF THE INVENTION

Japanese Patent Application Laid-Open Publication No. 11-204720 (Patent Document 1) discloses a technology in which an electrical connection between stacked semiconductor chips is made by wire bonding in a three-dimensional stacking type SiP (System in Package).

Japanese Patent Application Laid-Open Publication No. 2000-260934 (Patent Document 2) discloses a technology in which electrodes obtained by embedding solder or low melting metal by electrolytic plating method or electroless plating method into through holes formed in semiconductor chips are formed in stacked upper and lower semiconductor chips. Then, after applying heat, the electrodes buried in the through holes of the stacked upper and lower semiconductor chips are connected by the fusion joining, thereby electrically connecting the stacked upper and lower semiconductor chips.

Japanese Patent Application Laid-Open Publication No. 2005-340389 (Patent Document 3) discloses a technology in which a stud bump electrode is formed in an upper semiconductor chip of the stacked semiconductor chips and a through silicon via is formed in a lower semiconductor chip. Then, the stud bump electrode formed in the upper semiconductor chip is deformed and inserted by pressure welding to the through silicon via formed in the lower semiconductor chip to caulk the stud bump electrode and the through silicon via geometrically, thereby electrically connecting the upper and lower semiconductor chips.

Japanese Patent Application Laid-Open Publication No. 2005-93486 (Patent Document 4) discloses a technology of forming an electrode to extend a pad electrode formed on a surface of a silicon substrate via an interlayer insulating film to a rear surface of the silicon substrate. In this technology, a silicon substrate is etched from a rear surface of the silicon substrate with using a hard mask as a mask, thereby forming an opening whose bottom surface is the interlayer insulating film (FIG. 4C of Patent Document 4). Then, after removing the hard mask (FIG. 5A of Patent Document 4), an insulating film is formed on the entire rear surface of the silicon substrate including the inside of the opening (FIG. 5B of Patent Document 4). Thereafter, by etching the interlayer insulating film with using a resist film that covers the sidewall of the opening and the portion other than the opening (FIG. 5C of Patent Document 4) as a mask, the pad electrode is exposed on the bottom surface of the opening (FIG. 6A of Patent Document 4). By this means, a through hole reaching the pad electrode from the rear surface of the silicon substrate can be formed. Further, by embedding a metal material in the through hole, an electrode which is electrically connected to the pad electrode and reaches the rear surface of the silicon substrate can be formed. Note that it is mentioned here that, when removing the hard mask used in etching the silicon substrate, the interlayer insulating film exposed from the bottom surface of the opening is also partly etched and removed.

Japanese Patent Application Laid-Open Publication No. 2006-32699 (Patent Document 5) discloses the manufacturing technology of a semiconductor device as shown below. More specifically, a first insulating film is formed on a front surface of a semiconductor substrate, and a part of the first insulating film is selectively etched from a front surface side of the semiconductor substrate to the middle of the film thickness, thereby reducing the film thickness. By this etching, a concave portion having a bottom surface formed by partly removing the first insulating film is formed. Thereafter, a pad electrode is formed on the first insulating film including the inside of the concave portion (FIG. 16 of Patent Document 5). Subsequently, after forming a second insulating film on a rear surface of the semiconductor substrate, etching is performed so that an opening larger than the concave portion is formed in the second insulting film and the semiconductor substrate at a position corresponding to the concave portion of the first insulating film. By this etching, a via hole which has a hole diameter larger than that of the concave portion and penetrates through the second insulating film and the semiconductor substrate is formed (FIG. 17 of Patent Document 5). Next, after forming a third insulating film on the second insulating film including the inside of the via hole (FIG. 18 of Patent Document 5), the etching is performed from the rear surface of the semiconductor substrate. By this etching, the third insulating film formed on the second insulating film, the third insulating film formed on the bottom surface of the via hole and the first insulating film whose thickness is reduced are removed. By this means, the pad electrode is exposed on the bottom surface of the via hole (FIG. 19 of Patent Document 5). Then, by embedding a metal material in the through hole, an electrode that is electrically connected to the pad electrode and reaches the rear surface of the silicon substrate can be formed.

Japanese Patent Application Laid-Open Publication No. 2007-53149 (Patent Document 6) discloses a technology in which a contact electrode (through silicon via) to be connected to a pad is processed from a rear surface of a semiconductor substrate when stacking a plurality of semiconductor chips. More specifically, after a through hole having a conical opening is formed from a rear surface of the semiconductor substrate, an insulating film is formed on the rear surface of the semiconductor substrate including the inside of the through hole. Then, after removing the insulating film on the bottom surface of the through hole, a conductive film is formed on a wall surface of the through hole and then patterned, thereby forming a contact electrode.

Japanese Patent Application Laid-Open Publication No. 2006-222138 (Patent Document 7) discloses the manufacturing technology of a semiconductor device as shown below. More specifically, a method of forming a through silicon via which penetrates in a thickness direction of a semiconductor substrate is described therein. In this technology, a first insulating film is formed on a front surface of a semiconductor substrate, and a second insulating film is formed on a rear surface of the semiconductor substrate (FIG. 1(a) of Patent Document 7). Then, a first etching stop layer made of a conductive material having an etching rate different from that of the semiconductor substrate is formed on the second insulating film (FIG. 1(b) of Patent Document 7). Next, at a formation position of the through silicon via, a concave portion which penetrates through the first insulating film, the semiconductor substrate and the second insulating film and reaches the first etching stop layer is formed (FIG. 1(c) of Patent Document 7). Thereafter, the through silicon via is formed by embedding a conductive material in the concave portion by the plating method using the first etching stop layer as a seed layer (FIG. 1(d) to FIG. 1(f) of Patent Document 7).

SUMMARY OF THE INVENTION

In recent years, the development of SiP (System in Package) in which a plurality of semiconductor chips are mounted densely to realize a high-performance system in a short term has been in progress, and various mounting structures have been proposed by various manufacturers. In particular, SiP in which a plurality of chips are three-dimensionally stacked has an advantage in a mounting area.

As described in Japanese Patent Application Laid-Open Publication No. 11-204720 (Patent Document 1), a connection between semiconductor chips is made by wire bonding in general in a three-dimensional stacking type SiP. In the connection between semiconductor chips by wire bonding, however, a wiring has to be dropped onto a mounting board to make rewiring. As a result, the wiring between semiconductor chips becomes long, and the density of the wirings of the mounting board is increased. Accordingly, the inductance between wirings increases and high-speed transmission becomes difficult, and further, yield is deteriorated due to the increase in density of the wirings formed on the mounting board and the cost increase of a semiconductor device is caused.

For the problems of the wire bonding connection, a method in which an electrode penetrating through a semiconductor chip is formed to stack a plurality of chips is proposed. For example, Japanese Patent Application Laid-Open Publication No. 2000-260934 (Patent Document 2) discloses a technology in which electrodes obtained by embedding solder or low melting metal by electrolytic plating method or electroless plating method into through holes formed in semiconductor chips are formed in stacked upper and lower semiconductor chips. Then, after applying heat, the electrodes buried in the through holes of the stacked upper and lower semiconductor chips are connected by the fusion joining, thereby electrically connecting the stacked upper and lower semiconductor chips.

In addition, Japanese Patent Application Laid-Open Publication No. 2005-340389 (Patent Document 3) discloses a technology in which a stud bump electrode is formed in an upper semiconductor chip of the stacked semiconductor chips and a through silicon via is formed in a lower semiconductor chip. Then, the stud bump electrode formed in the upper semiconductor chip is deformed and inserted by pressure welding to the through silicon via formed in the lower semiconductor chip to caulk the stud bump electrode and the through silicon via geometrically, thereby electrically connecting the upper and lower semiconductor chips.

For example, in the technology described in Japanese Patent Application Laid-Open Publication No. 2005-340389 (Patent Document 3), a through silicon via which reaches a pad formed on the surface of a semiconductor wafer from a rear surface of the semiconductor wafer is formed. Since wiring layers are formed over multiple layers on a semiconductor wafer on which a highly integrated circuit such as a microcomputer is formed, a thick interlayer insulating film is formed on the surface of the semiconductor wafer. Therefore, when a through silicon via which reaches the pad formed on the front surface of the semiconductor wafer from the rear surface of the semiconductor wafer is to be formed, the hole has to be formed and processed through the thick interlayer insulating film. When a hole reaching the pad with the same diameter as a through silicon via is formed according to the process suggested in Japanese Patent Application Laid-Open Publication No. 2005-340389 (Patent Document 3), the support of the interlayer insulating film to which most of the pad is adjacent is lost, and the problem of the decrease in pad strength is caused.

Thus, in order to suppress the decrease in the pad strength, the technology in which the hole diameter is changed in the middle of the processing of the hole so that a hole with a small diameter (second hole) is formed in the interlayer insulating film adjacent to the pad is considered. In this technology, by etching the semiconductor substrate until the interlayer insulating film is exposed, the hole with a large diameter (first hole) is formed, and the hole with a small diameter (second hole) is then formed by processing the interlayer insulating film. At this time, a resist mask has to be formed in the first hole with a large diameter (first hole). Then, although the interlayer insulating film is etched with using the formed resist mask as a mask, the resist mask is also etched easily in the etching of the interlayer insulating film. In other words, the resist mask is selectively processed in comparison with the interlayer insulating film, and the resist mask disappears before the completion of the processing of the interlayer insulating film. As a result, a resist mask has to be formed multiple times until the completion of the formation of the hole with a small diameter (second hole) in the interlayer insulating film.

However, due to the small diameter of the hole (second hole), the resist mask in the hole (second hole) cannot be completely removed by cleaning, and further, the bottom surface of the hole (second hole) is roughened in the processing of the interlayer insulating film due to the misalignment of resist masks formed multiple times, and the exposure in the lithography process cannot be performed appropriately. Therefore, it is difficult to form a resist mask of second and subsequent times in the hole with a large diameter (first hole). As a result, the processing state of the interlayer insulating film in the hole with a small diameter (second hole) becomes nonuniform, and the problem that the manufacturing yield of a semiconductor device is deteriorated is caused.

An object of the present invention is to provide a technology capable of improving the manufacturing yield of a semiconductor device having a plurality of semiconductor chips stacked three-dimensionally.

The above and other objects and novel characteristics of the present invention will be apparent from the description of this specification and the accompanying drawings.

The typical ones of the inventions disclosed in this application will be briefly described as follows.

A manufacturing method of a semiconductor device according to the present invention comprises the steps of: (a) forming an interlayer insulating film on a semiconductor element formed on a first surface of a semiconductor substrate, and forming a pad electrically connected to the semiconductor element via a wiring formed in the interlayer insulating film on a surface of the interlayer insulating film; (b) forming a first resist film on a second surface of the semiconductor substrate on a side opposite to the first surface; (c) patterning the first resist film to form a first opening at a position facing to the pad; (d) forming a first hole, which exposes the interlayer insulating film on a bottom surface, in the semiconductor substrate by etching the semiconductor substrate with using the first resist film, in which the first opening is formed, as a mask; (e) removing the first resist film; (f) etching the interlayer insulating film exposed on the bottom surface of the first hole, thereby forming the bottom surface of the first hole at a position on the interlayer insulating film and closer to the pad than an interface between the semiconductor substrate and the interlayer insulating film; (g) forming an insulating film on the second surface of the semiconductor substrate including an inner wall of the first hole; (h) forming a second resist film on the insulating film; (i) patterning the second resist film to form a second opening with a diameter smaller than that of the first hole in the bottom surface of the first hole; (j) forming a second hole, which exposes the pad on a bottom surface, by etching the insulating film and the interlayer insulating film with using the second resist film, in which the second opening is formed, as a mask; and (k) forming a conductive film on the second surface of the semiconductor substrate including an inner wall of the first hole and an inner wall of the second hole and then patterning the conductive film, thereby forming a through silicon via reaching the first surface from the second surface of the semiconductor substrate and electrically connected to the pad, wherein a surface of the interlayer insulating film on a side of the semiconductor substrate has a step shape reflecting a step difference between the bottom surface of the first hole and the first surface of the semiconductor substrate, and a surface of the conductive film has a step shape reflecting a step difference between the second surface of the semiconductor substrate and the bottom surface of the first hole.

A semiconductor device according to the present invention comprises: (a) a semiconductor substrate; (b) a semiconductor element formed on a first surface of the semiconductor substrate; (c) an interlayer insulating film formed on the first surface of the semiconductor substrate; (d) a pad formed on the interlayer insulating film; (e) a bump electrode formed on the pad; and (f) a through silicon via reaching the pad from a second surface of the semiconductor substrate on a side opposite to the first surface, wherein the through silicon via includes: (f1) a first hole reaching the interlayer insulating film from the second surface of the semiconductor substrate on a side opposite to the first surface, the first hole having a bottom surface formed to a position closer to the pad than an interface between the interlayer insulating film and the semiconductor substrate; (f2) a second hole having a diameter smaller than that of the first hole and reaching the pad from the bottom surface of the first hole; (f3) an insulating film formed on a bottom surface and a side surface of the first hole and the second surface of the semiconductor substrate; and (f4) a conductive film formed on a bottom surface and a side surface of the second hole, a bottom surface and a side surface of the first hole via the insulating film, and the second surface of the semiconductor substrate, and electrically connected to the pad, wherein a surface of the interlayer insulating film on a side of the semiconductor substrate has a step shape reflecting a step difference between the bottom surface of the first hole and the first surface of the semiconductor substrate, and a surface of the conductive film has a step shape reflecting a step difference between the second surface of the semiconductor substrate and the bottom surface of the first hole.

The effects obtained by typical aspects of the present invention will be briefly described below.

The manufacturing yield a semiconductor device having a plurality of semiconductor chips stacked three-dimensionally can be improved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, components having the same function are denoted by the same reference numbers throughout the drawings for describing the embodiment, and the repetitive description thereof will be omitted. Further, in order to make the drawings easy to understand, hatching is applied even in the plan view in some cases.

First Embodiment

In the first embodiment, the description will be made with reference to the drawings with using a semiconductor device in which a highly integrated circuit is mounted like a microcomputer chip as an example.

Figure 1:
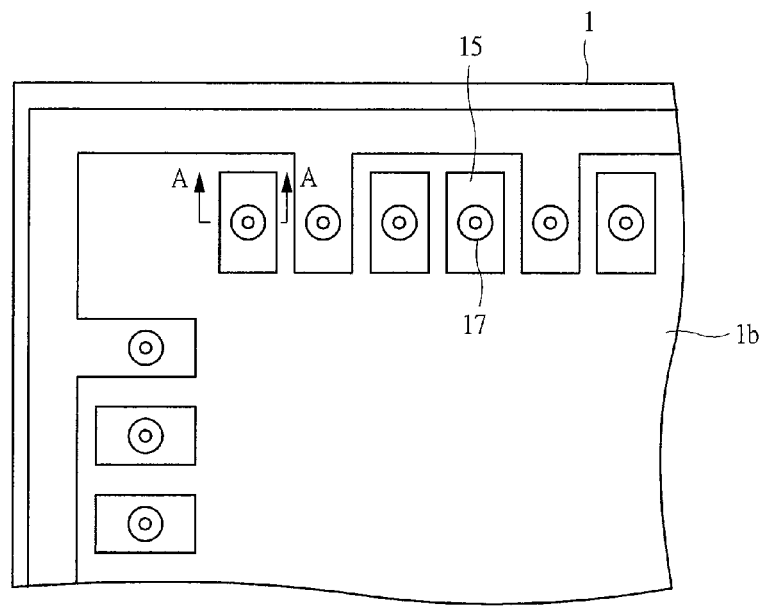
FIG. 1 is a plan view showing a part of a semiconductor chip in the first embodiment of the present invention.

FIG. 1 is a plan view showing a semiconductor chip according to the first embodiment. FIG. 1 is a drawing showing a part of a semiconductor chip on a side of a second surface (rear surface) 1b of a semiconductor substrate 1 seen from above. As shown in FIG. 1, the semiconductor chip is constituted of the semiconductor substrate 1 of a rectangular shape, and a plurality of through silicon vias 17 are formed in the second surface 1b of the semiconductor substrate 1. Also, the plurality of through silicon vias 17 are connected to wirings formed of a conductive film 15, and a wiring pattern is formed by these wirings on the second surface 1b of the semiconductor substrate 1. As mentioned above, in the first embodiment, the plurality of through silicon vias 17 are formed in a semiconductor chip, and the through silicon via 17 is configured so as to form double rings planarly as shown in FIG. 1. This is because a penetration space of the through silicon via 17 is formed of a first hole with a large diameter and a second hole with a diameter smaller than the diameter of the first hole as described below.

Figure 2:
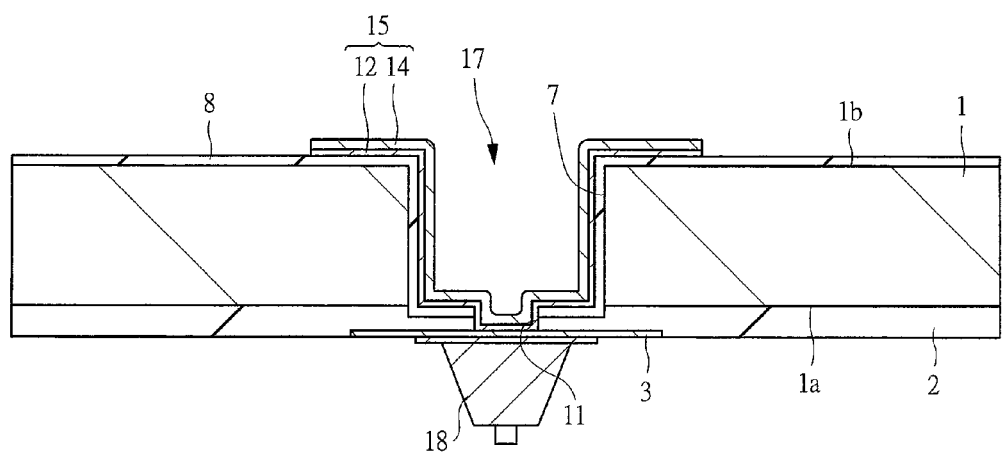
FIG. 2 is a cross-sectional view showing a cross section taken along the line A-A in FIG. 1.

FIG. 2 is a cross-sectional view showing a cross section taken along the line A-A in FIG. 1. As shown in FIG. 2, the semiconductor substrate 1 is in a shape of a flat plate and has a first surface (front surface) 1a and a second surface (rear surface) 1b. On the first surface 1a of the semiconductor substrate 1, a semiconductor element (MISFET (Metal Insulator Semiconductor Field Effect Transistor)) (not shown) constituting a highly integrated circuit is formed, and an interlayer insulating film 2 is formed on the first surface 1a of the semiconductor substrate 1 on which the semiconductor element is formed. In the interlayer insulating film 2, wirings to connect a plurality of semiconductor elements are formed over multiple layers, and the highly integrated circuit is formed on the first surface 1a of the semiconductor substrate 1 by the plurality of semiconductor elements formed on the first surface 1a of the semiconductor substrate 1 and the wirings to connect these semiconductor elements. Here, the first embodiment is directed to a semiconductor chip on which a highly integrated circuit is formed such as a microcomputer chip, and the feature thereof lies in that a number of wiring layers are provided. Therefore, the thickness of the interlayer insulating film 2 in which wiring layers are formed over multiple layers tends to increase. As described above, the first embodiment is directed to a semiconductor device in which the film thickness of the interlayer insulating film 2 is relatively large.

Next, a pad (electrode) 3 is formed on a front surface which is the uppermost layer of the interlayer insulating film 2. The pad 3 is electrically connected to the semiconductor element via the wiring formed in the interlayer insulating film 2, and the pad 3 functions as an external terminal to interface between the highly integrated circuit formed on the semiconductor substrate 1 and the outside of the semiconductor chip. Also, a stud bump electrode 18 is formed on the pad 3.

Meanwhile, a through silicon via 17 is formed so that it penetrates from the second surface 1b of the semiconductor substrate 1 to the first surface 1a of the semiconductor substrate 1 and further penetrates through the interlayer insulating film 2 and then electrically connected to the pad 3. The through silicon via 17 is needed when a plurality of semiconductor chips are three-dimensionally stacked to be packaged. In other words, an SiP structure in which semiconductor chips are stacked to be packaged is assumed in the first embodiment, and the through silicon via 17 is used to electrically connect the semiconductor chips disposed above and below when stacking the semiconductor chips. As described above, in each semiconductor chip, the stud bump electrode 18 is formed on one side of the pad 3, and the through silicon via 17 is formed on the other side of the pad 3. Further, when stacking a plurality of semiconductor chips, the stud bump electrode 18 of the other semiconductor chip is deformed and inserted by pressure welding to the through silicon via 17 of one semiconductor chip to caulk the through silicon via 17 and the stud bump electrode 18 geometrically, thereby electrically connecting the semiconductor chips while stacking them above and below. As described above, it is assumed in the first embodiment that the semiconductor chips are stacked using the through silicon via 17 and the stud bump electrode 18. Note that, in the region where the through silicon via 17 is formed, a semiconductor element constituting a highly integrated circuit is not formed. In other words, although a semiconductor element is formed on the first surface 1a of the semiconductor substrate 1, the semiconductor element is formed in a region separated from the region in which the through silicon via 17 is formed.

Next, the structure of the through silicon via 17 will be described below. As shown in FIG. 2, the penetration space of the through silicon via 17 is formed of the first hole 7 and the second hole 11. In other words, the first hole 7 is formed from the second surface 1b of the semiconductor substrate 1, and the second hole 11 with a diameter smaller than that of the first hole 7 is formed in the bottom surface of the first hole 7. Further, the pad 3 is exposed on bottom surface of the second hole 11. An insulating film 8 is formed on the bottom surface and the side surface of the first hole 7 and on the second surface 1b of the semiconductor substrate 1, and a seed layer 12 and a plating layer 14 are stacked and formed on the bottom surface and the side surface of the second hole 11, on the bottom surface and the side surface of the first hole 7 via the insulating film 8, and on the second surface 1b of the semiconductor substrate 1 via the insulating film 8. The seed layer 12 and the plating layer 14 are referred to as a conductive film 15 in combination. The conductive film 15 formed on the second surface 1b of the semiconductor substrate 1 forms the wiring pattern shown in FIG. 1. The through silicon via 17 is configured in the manner as described above, and the through silicon via 17 has a hollow therein to form a penetration space to which the stud bump electrode 18 formed in another semiconductor chip to be stacked is inserted. Therefore, the conductive film 15 constituting the through silicon via 17 has a step shape reflecting a step difference between the second surface 1b of the semiconductor substrate 1 and the bottom surface of the first hole 7 and a step difference between the bottom surface of the first hole 7 and the bottom surface of the second hole 11. In other words, in the through silicon via 17 according to the first embodiment, the first hole 7 and the second hole 11 are not completely filled with the conductive film 15, but the penetration space is formed therein. More specifically, if the through silicon via 17 is completely filled with the conductive film 15, the surface of the conductive film 15 coincides with the second surface 1b of the semiconductor substrate 1, and no step difference is caused therebetween. In contrast, when the structure in which the hollow is present inside the through silicon via 17 is adopted, the conductive film 15 constituting the through silicon via 17 has a step shape reflecting a step difference between the second surface 1b of the semiconductor substrate 1 and the bottom surface of the first hole 7 and a step difference between the bottom surface of the first hole 7 and the bottom surface of the second hole 11.

Subsequently, the reason why the through silicon via 17 is formed of the first hole 7 and the second hole 11 with a hole diameter smaller than that of the first hole 7 will be described. For example, the hole diameter of the first hole 7 is formed in accordance with the size of the stud bump electrode 18 to be inserted therein, but if the through silicon via 17 is formed of only the first hole 7 with a large hole diameter, the following problem occurs. That is, although the through silicon via 17 is configured to penetrate to the pad 3 from the second surface 1b of the semiconductor substrate 1, when the penetration space penetrating to the pad 3 from the second surface 1b of the semiconductor substrate 1 is formed of only the first hole 7, the amount of the semiconductor substrate 1 and the interlayer insulating film 2 removed in the formation of the first hole 7 increases. Since pad 3 is formed on the surface of the interlayer insulating film 2 and the interlayer insulating film 2 to which most of the pad 3 contacts is removed, the pad 3 loses the support by the interlayer insulating film 2 and the problem of the decrease in strength of the pad 3 becomes evident. Therefore, instead of forming the through silicon via 17 by only the first hole 7 with a large hole diameter, the second hole 11 with a hole diameter smaller than that of the first hole 7 is formed between the first hole 7 and the pad 3. In other words, by forming the second hole 11 with a hole diameter smaller than that of the first hole 7 in the interlayer insulating film 2, the amount of the interlayer insulating film 2 removed by forming the through silicon via 17 can be reduced. In this manner, the interlayer insulating film 2 which supports the pad 3 can be secured, and the decrease in strength of the pad 3 can be suppressed. As described above, the decrease in strength of the pad 3 can be suppressed by forming the through silicon via 17 from the first hole 7 and the second hole 11 with a hole diameter smaller than that of the first hole 7. Note that the decrease in strength of the pad 3 caused by forming the through silicon via 17 is the problem which occurs particularly in the case where the through silicon via 17 has a hollow therein. For example, in the case where the through silicon via 17 is completely filled with the conductive film 15, since the pad 3 is supported by the conductive film 15 embedded in the through silicon via 17, it is not necessary to form the through silicon via 17 from the holes with different hole diameters. More specifically, the structure in which the through silicon via 17 is formed from the first hole 7 with a large hole diameter and the second hole 11 with a hole diameter smaller than that of the first hole 7 and the pad 3 is exposed on the bottom surface of the second hole 11 is useful in the case where the through silicon via 17 has a hollow therein. In other words, the structure in which the through silicon via 17 is formed from the first hole 7 with a large hole diameter and the second hole 11 with a hole diameter smaller than that of the first hole 7 does not have any usability in the case where the through silicon via 17 is filled with the conductive film 15.

The structure in which the through silicon via 17 has a hollow therein and the through silicon via 17 is formed from the first hole 7 and the second hole 11 with a hole diameter smaller than that of the first hole 7 is the structure to be a premise of the present invention.

Here, the matter to be considered is the position to switch the first hole 7 and the second hole 11 constituting the through silicon via 17. Actually, the semiconductor substrate 1 is made of silicon, and the interlayer insulating film 2 is formed of a silicon oxide film. Accordingly, the silicon is etched from the second surface 1b of the semiconductor substrate 1 to the first surface 1a of the semiconductor substrate 1 which is an interface between the semiconductor substrate 1 and the interlayer insulating film 2, thereby forming the first hole 7, and then, the interlayer insulating film 2 formed of a silicon oxide film is etched until the pad 3 is exposed from the first surface 1a of the semiconductor substrate 1 which is an interface between the semiconductor substrate 1 and the interlayer insulating film 2, thereby forming the second hole 11 in general. Note that the stud bump electrode 18 formed in another semiconductor chip is inserted into the first hole 7. However, since the thickness of the semiconductor substrate 1 is generally larger than the height of the stud bump electrode 18, there occurs no problem when the first hole 7 is formed from the second surface 1b of the semiconductor substrate 1 to the first surface 1a of the semiconductor substrate 1 which is an interface between the semiconductor substrate 1 and the interlayer insulating film 2.

As described above, in the case where the silicon is etched from the second surface 1b of the semiconductor substrate 1 to the first surface 1a of the semiconductor substrate 1 which is an interface between the semiconductor substrate 1 and the interlayer insulating film 2, thereby forming the first hole 7, and then, the interlayer insulating film 2 formed of a silicon oxide film is etched until the pad 3 is exposed from the first surface 1a of the semiconductor substrate 1 which is an interface between the semiconductor substrate 1 and the interlayer insulating film 2, thereby forming the second hole 11, the following problems occur. The first embodiment is directed to a semiconductor chip on which a highly integrated circuit is formed such as a microcomputer chip, and the feature thereof lies in that a number of wiring layers are provided. Therefore, the thickness of the interlayer insulating film 2 in which wiring layers are formed over multiple layers tends to increase. It is difficult to form the second hole 11 in the interlayer insulating film 2 with a large thickness as described above. The reason for this will be described below.

For the formation of the second hole 11, after the semiconductor substrate 1 made of silicon is etched to form the first hole 7, the insulating film 8 is formed on the second surface 1b of the semiconductor substrate 1 including the bottom surface of the first hole 7. Thereafter, a resist film is formed on the second surface 1b of the semiconductor substrate 1 including the bottom surface of the first hole 7 via the insulating film 8. Then, the resist film is patterned to form an opening smaller than the hole diameter of the first hole in the bottom surface of the first hole 7. Then, the insulating film 8 and the interlayer insulating film 2 formed of a silicon oxide film are etched with using the patterned resist film as a mask, thereby forming the second hole 11. Here, when the insulating film 8 and the interlayer insulating film 2 formed of a silicon oxide film are etched, the resist film used as a mask is also etched easily. Therefore, when the interlayer insulating film 2 has a large thickness, the resist film disappears before the second hole 11 formed in the interlayer insulating film 2 penetrates through the interlayer insulating film 2 and reaches the pad 3. Therefore, a new resist film has to be formed and patterned again and the interlayer insulating film 2 formed of a silicon oxide film has to be etched again. In other words, since the resist film is also etched when forming the second hole 11, when the interlayer insulating film 2 has a large thickness, the mask formed of a resist film has to be formed multiple times before the second hole 11 penetrates through the interlayer insulating film 2 and reaches the pad 3.

At this time, due to the small diameter of the second hole 11, the resist film in the second hole 11 cannot be completely removed by cleaning, and further, the bottom surface of the second hole 11 is roughened in the processing of the interlayer insulating film 2 due to the misalignment of resist masks formed multiple times, and the exposure in the lithography process cannot be performed appropriately. Therefore, it is difficult to form a resist mask of second and subsequent times on the bottom surface of the first hole 7. As a result, the processing state of the interlayer insulating film 2 in the second hole 11 becomes nonuniform, and the pad 3 cannot be normally exposed on the bottom surface of the second hole 11. Accordingly, the through silicon via 17 cannot be formed appropriately, and the problem that the manufacturing yield of a semiconductor device is deteriorated is caused.

Therefore, in the first embodiment, the first hole 7 is formed to the position deeper than the first surface 1a of the semiconductor substrate 1 which is an interface between the semiconductor substrate 1 and the interlayer insulating film 2 as shown in FIG. 2. More specifically, the first hole 7 is formed not only in the semiconductor substrate 1 made of silicon but also to the middle of the interlayer insulating film 2. By this means, the thickness of the interlayer insulating film 2 between the bottom surface of the first hole 7 and the pad 3 is reduced. Then, the second hole 11 is formed in the interlayer insulating film 2 with reduced thickness. In other words, one of the features of the first embodiment lies in that, when the first hole 7 is to be formed, not only the semiconductor substrate 1 made of silicon but also the interlayer insulating film 2 are etched, by which the bottom surface of the first hole 7 is formed to the position on the interlayer insulating film 2 and closer to the pad 3 than the interface between the semiconductor substrate 1 and the interlayer insulating film 2 (first surface 1a of the semiconductor substrate 1). By this means, even in a semiconductor device in which the interlayer insulating film 2 has a large thickness such as a microcomputer chip in which a highly integrated circuit is formed, the thickness of the interlayer insulating film 2 to be etched to form the second hole 11 can be reduced.

Since the thickness of the interlayer insulating film 2 between the bottom surface of the first hole 7 and the pad 3 can be reduced by forming the first hole 7 to the middle of the interlayer insulating film 2, when the second hole 11 reaching the pad 3 from the bottom surface of the first hole 7 is formed, the second hole 11 reaching the pad 3 can be formed with using the mask of a resist film only once. In other words, the combined thickness of the interlayer insulating film 2 remaining between the bottom surface of the first hole 7 and the pad 3 and the insulating film 8 formed on the bottom surface of the first hole 7 can be set to the thickness capable of forming the second hole 11 before the resist film of the first time used as a mask disappears when forming the second hole 11. By this means, the processing failure of the second hole 11 due to that the bottom surface of the second hole 11 is roughened in the processing of the interlayer insulating film 2 by the misalignment of the masks formed multiple times and the exposure in the lithography process cannot be performed appropriately can be prevented. Thus, reliability of the through silicon via 17 can be improved, and the manufacturing yield of a semiconductor device can be improved. Further, since the connection variations between the second hole 11 and the pad 3 due to the processing failure of the interlayer insulating film 2 can be suppressed, the variations in connection resistance between the through silicon via 17 and the pad 3 can be suppressed.

One of the features of the first embodiment lies in that the thickness of the interlayer insulating film 2 between the bottom surface of the first hole 7 and the pad 3 can be reduced by forming the first hole 7 to the middle of the interlayer insulating film 2, and as the structure of the semiconductor device according to the first embodiment, the surface of the interlayer insulating film 2 in contact to the semiconductor substrate 1 has a step shape reflecting the step difference between the bottom surface of the first hole 7 and the first surface 1*a* of the semiconductor substrate 1. More specifically, in the region where the first hole 7 is not formed, the first surface 1*a* of the semiconductor substrate 1 serves as the interface between the semiconductor substrate 1 and the interlayer insulating film 2, and in the region where the first hole 7 is formed, the bottom surface of the first hole 7 serves as the interface with the interlayer insulating film 2. Since the bottom surface of the first hole 7 is formed beyond the first surface 1*a* of the semiconductor substrate 1 to the middle of the interlayer insulating film 2 in this embodiment, the surface of the interlayer insulating film 2 in contact to the semiconductor substrate 1 has a step shape.

The semiconductor chip in the first embodiment is configured as described above, and the manufacturing method thereof will be described below with reference to the accompanying drawings.

First, the semiconductor substrate 1 is prepared. At this time, the semiconductor substrate 1 is generally in a state of an approximately disk-shaped semiconductor wafer, and a plurality of chip regions are formed on this semiconductor wafer. In the process shown below, the semiconductor substrate 1 is processed in a state of a semiconductor wafer.

Figure 3:
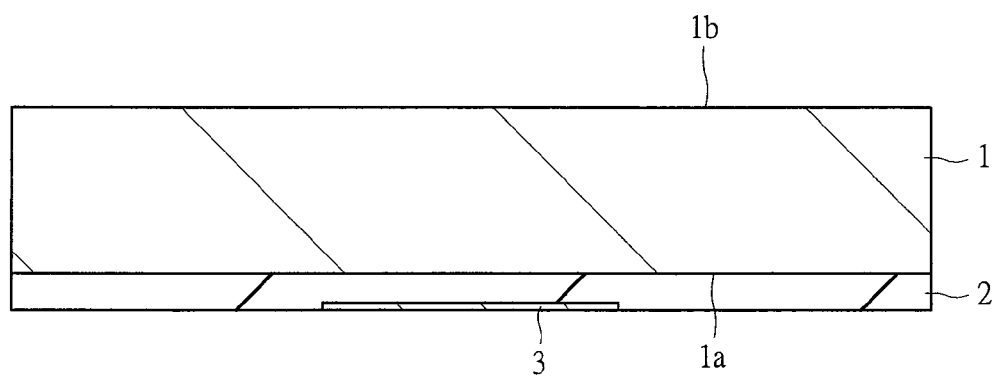
FIG. 3 is a cross-sectional view showing a manufacturing process of a semiconductor device in the first embodiment.

As shown in FIG. 3, a plurality of semiconductor elements (not shown) are formed by using usual MISFET formation technology on the first surface 1*a* of the semiconductor substrate 1, and the interlayer insulating film 2 is formed on the first surface 1*a* of the semiconductor substrate 1 on which the plurality of semiconductor elements are formed. The interlayer insulating film 2 is formed of, for example, a silicon oxide film. Wirings (not shown) are formed in this interlayer insulating film 2 over multiple layers, and the plurality of semiconductor elements are connected by the wirings. Then, the pad 3 electrically connected to the semiconductor element via the wiring formed in the interlayer insulating film 2 is formed on the surface of the interlayer insulating film 2. The pad 3 is formed of, for example, an aluminum film.

When the thickness of the semiconductor substrate 1 is reduce to, for example, 10 μm to 50 μm, the depth of the through silicon via formed in the process described later is reduced, and the degree of processing difficulty decreases. However, due to the decrease in strength of the semiconductor substrate 1 and the warpage of the semiconductor substrate 1 caused by the thickness reduction of the semiconductor substrate 1, the yield is deteriorated.

Figure 4:
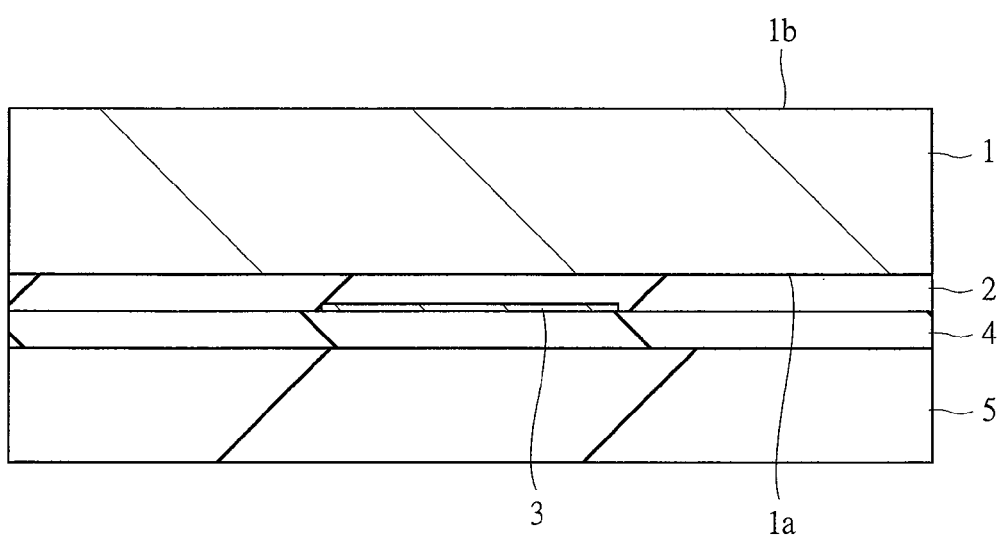
FIG. 4 is a cross-sectional view showing the manufacturing process of a semiconductor device continued from FIG. 3.

Therefore, in the first embodiment, an adhesion layer 4 is applied onto the surface of the interlayer insulating film 2 forming the pad 3, and a supporting substrate 5 made of, for example, quartz, glass or a silicon substrate and the semiconductor substrate 1 are adhered as shown in FIG. 4. By adhering the supporting substrate 5 to the semiconductor substrate 1, the decrease in strength of the semiconductor substrate 1 and the warpage of the semiconductor substrate 1 due to the thickness reduction of the semiconductor substrate 1 can be suppressed. Further, the adhesion layer 4 has a function to adhere the supporting substrate 5 and the semiconductor substrate 1 and a function to protect an integrated circuit formed on the semiconductor substrate 1.

Figure 5:
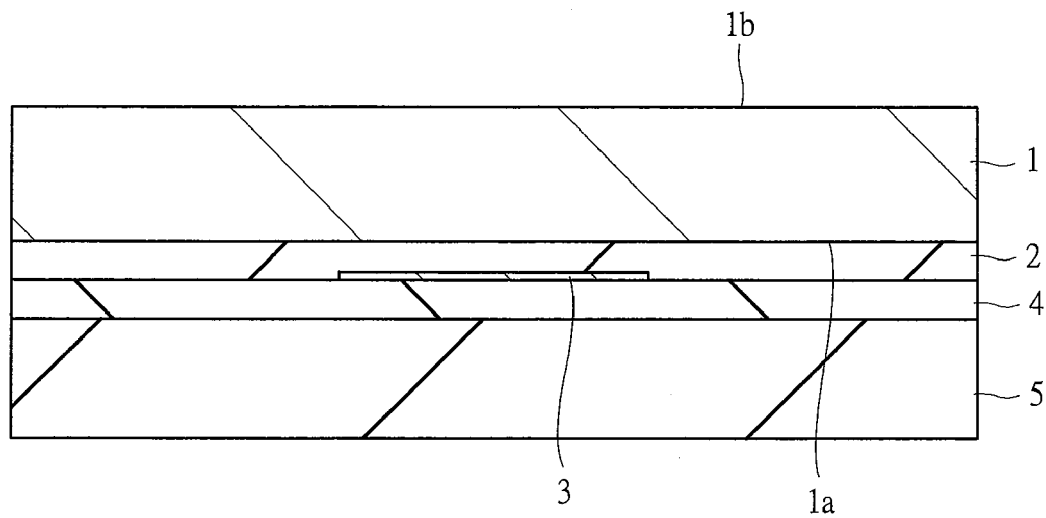
FIG. 5 is a cross-sectional view showing the manufacturing process of a semiconductor device continued from FIG. 4.

Next, as shown in FIG. 5, the thickness of the semiconductor substrate 1 is reduced by performing the back grinding process to the second surface 1*b* of the semiconductor substrate 1. The back grinding process can be executed by grinding or polishing. Since the planarity after the back grinding process affects the accuracy of the through silicon via formed in the second surface 1*b* of the semiconductor substrate 1, it is desirable that the polishing by means of dry polishing, etching, or CMP (Chemical Mechanical Polishing) is performed to planarize the second surface 1*b* of the semiconductor substrate 1 after performing the back grinding process.

Figure 6:
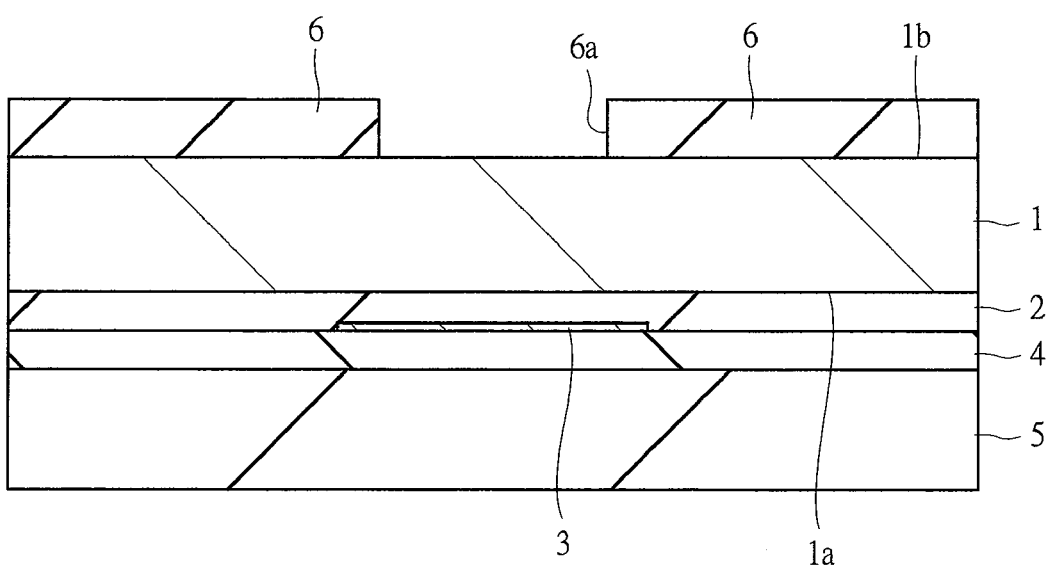
FIG. 6 is a cross-sectional view showing the manufacturing process of a semiconductor device continued from FIG. 5.

Subsequently, as shown in FIG. 6, a resist film 6 is applied onto the second surface 1*b* of the semiconductor substrate 1. Then, the resist film 6 is patterned by using the photolithography technology. The resist film 6 is patterned so that an opening 6*a* is formed at a position of the resist film 6*a* corresponding to the pad 3. For example, as a method to apply the resist film 6 onto the second surface 1*b* of the semiconductor substrate 1, the spinner coating method can be used. Further, the position where the opening 6*a* is formed by patterning the resist film 6 is determined by inspecting the pattern (device pattern) of the semiconductor element formed on the first surface 1*a* of the semiconductor substrate 1 with an infrared microscope. Then, the semiconductor substrate 1 made of silicon is etched with using the patterned resist film 6 as a mask.

Figure 7:
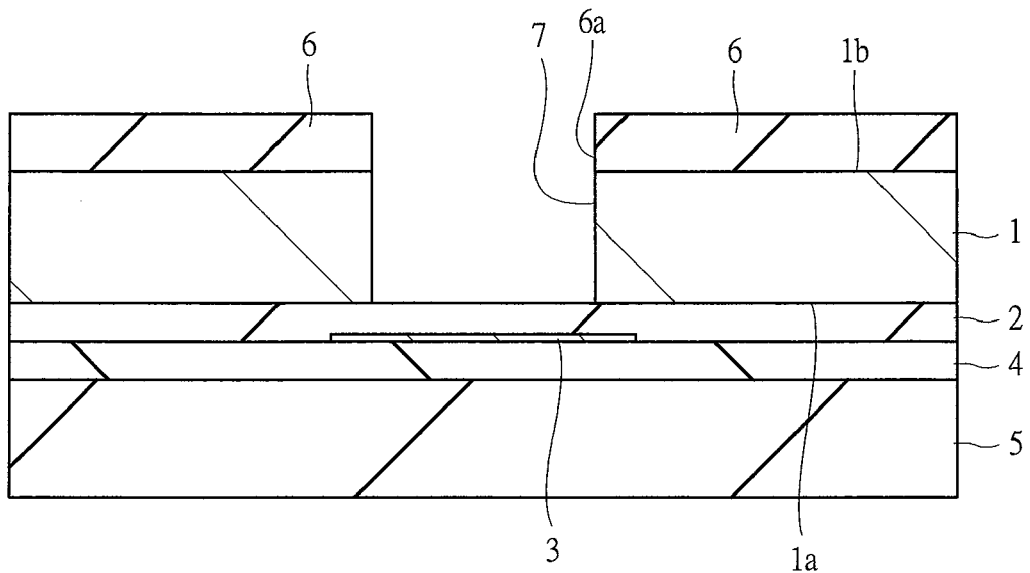
FIG. 7 is a cross-sectional view showing the manufacturing process of a semiconductor device continued from FIG. 6.

More specifically, as shown in FIG. 7, the first hole 7 which reaches the interlayer insulating film 2 from the second surface 1*b* of the semiconductor substrate 1 made of silicon is formed. This etching is anisotropic etching and is performed by, for example, ICP-RIE (Inductively Coupled Plasma Reactive Ion Etching). As the etching gas, $SF_6$ and $C_4H_8$ are used. In the dry etching of silicon, a silicon oxide film functions as an etching stopper in general. Therefore, in the etching by $SF_6$ and $C_4H_8$, the etching stops by the interlayer insulating film 2 mainly formed of a silicon oxide film. The depth of the first hole 7 at this time is determined by the thickness of the semiconductor substrate 1.

Figure 8:
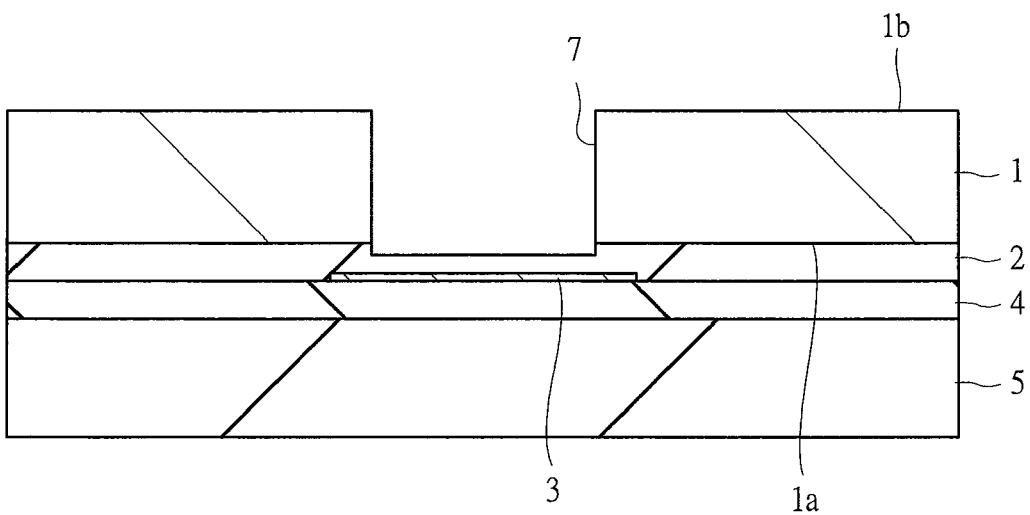
FIG. 8 is a cross-sectional view showing the manufacturing process of a semiconductor device continued from FIG. 7.

Next, as shown in FIG. 8, after removing the patterned resist film 6, the interlayer insulating film 2 exposed on the bottom surface of the first hole 7 is etched to the middle with using the mixed gas of $C_3F_8$, Ar and $CHF_4$ as the etching gas instead of $SF_6$ and $C_4H_8$ without forming a mask of a new resist film. More specifically, the interlayer insulating film 2 exposed on the bottom surface of the first hole 7 is etched with using the semiconductor substrate 1 made of silicon and the first hole 7 formed in the semiconductor substrate 1. By this means, the thickness of the interlayer insulating film 2 between the bottom surface of the first hole 7 and the pad 3 can be reduced. In other words, one of the features of the first embodiment lies in that the process of etching the interlayer insulating film 2 exposed on the bottom surface of the first hole 7 is performed intentionally with using the semiconductor substrate 1 made of silicon and the first hole 7 formed in the semiconductor substrate 1 as a mask. By intentionally etching the interlayer insulating film 2 with using the first hole 7 as a mask, the etching of the interlayer insulating film 2 proceeds with the hole diameter equal to that at the bottom of the first hole 7 (see, FIG. 7) formed in the semiconductor substrate 1 made of silicon. Therefore, as shown in FIG. 8, the bottom surface of the first hole 7 formed by etching the interlayer insulating film 2 has a hole diameter almost equal to that of the bottom surface of the first hole 7 formed by etching the silicon shown in FIG. 7. Note that, by performing this process, in the region where the first hole 7 is not formed, the first surface 1a of the semiconductor substrate 1 serves as an interface between the semiconductor substrate 1 and the interlayer insulating film 2, and in the region where the first hole 7 is formed, the bottom surface of the first hole 7 serves as an interface with the interlayer insulating film 2. In this embodiment, since the bottom surface of the first hole 7 is formed beyond the first surface 1a of the semiconductor substrate 1 to the middle of the interlayer insulating film 2, the surface of the interlayer insulating film 2 in contact to the semiconductor substrate 1 has a step shape.

By intentionally etching the interlayer insulating film 2 exposed from the first hole 7 to the middle, the effect that the thickness of the interlayer insulating film 2 between the bottom surface of the first hole 7 and the pad 3 can be reduced can be achieved, and the effect as follows can be further achieved.

In the process of forming the first hole 7 by etching the semiconductor substrate 1 made of silicon, the overetching is performed to completely expose the bottom surface of the first hole 7. In other words, a plurality of first holes 7 are formed in the semiconductor substrate 1, and at this time, the etching rate differs depending on the places to form the first holes 7. For example, although the etching proceeds sufficiently in the first hole 7 formed in a certain region and the interlayer insulating film 2 is exposed on the bottom surface of the first hole 7, the etching is insufficient in the first hole 7 formed in another region and the interlayer insulating film 2 is not exposed in some cases. In such a case, unless the overetching is performed, silicon remains on the bottom surface of the first hole 7 where the etching of silicon is insufficient, and there is the fear that the normal through silicon via cannot be formed afterward. For its prevention, by performing the overetching, the silicon is completely removed even on the bottom surface of the first hole 7 in the region where the etching is insufficient, and the interlayer insulating film 2 is exposed on the bottom surface of the first hole 7.

However, by performing the overetching, the notch occurs in the first hole 7 in which the etching has proceeded sufficiently. More specifically, when the silicon in the first hole 7 in which the etching has proceeded sufficiently is further etched, since the interlayer insulating film 2 to be an etching stopper is exposed on the bottom surface of the first hole 7, the etching does not proceed in a depth direction. However, silicon is eroded in a lateral direction (side direction) from the bottom surface of the first hole 7, and the notch occurs. The occurrence of the notch will cause the failure in the semiconductor device.

Here, in the first embodiment, after the semiconductor substrate 1 made of silicon is etched to form the first hole 7, the interlayer insulating film 2 is etched with using the first hole 7 as a mask, thereby forming the first hole 7 with the same diameter. Thus, even if the overetching of the semiconductor substrate 1 made of silicon is not performed, the silicon remaining on the bottom surface of the first hole 7 in which the etching of silicon is insufficient can be removed by the etching of the interlayer insulating film 2 using the first hole 7 as a mask. In other words, silicon slightly remaining on the bottom surface of the first hole 7 can be removed in the etching of the interlayer insulating film 2 mainly formed of a silicon oxide film. Accordingly, the overetching in the process of forming the first hole 7 by etching the semiconductor substrate 1 made of silicon can be suppressed. As described above, according to the first embodiment, since the overetching can be suppressed, the occurrence of the notch in the first hole 7 in which the etching has proceeded sufficiently can be suppressed.

Also, according to this first embodiment, another effect can be achieved. For example, the problem that the stress is generated in the semiconductor substrate 1 when processing the semiconductor substrate 1 and the semiconductor substrate 1 is warped occurs frequently. In the first embodiment, however, the process of etching the interlayer insulating film 2 exposed on the bottom surface of the first hole 7 is intentionally performed with using the first hole 7 formed in the silicon as a mask and without using a resist film as a mask. When the dry etching is performed in a state where silicon is exposed without using a resist film as described above, the stress generated in the semiconductor substrate 1 can be relieved (stress relief effect).

Figure 9:
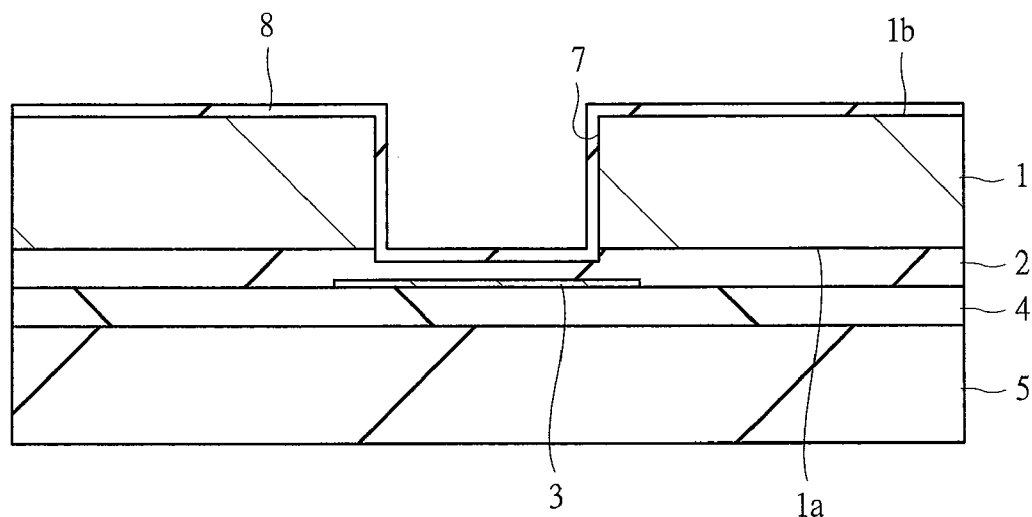
FIG. 9 is a cross-sectional view showing the manufacturing process of a semiconductor device continued from FIG. 8.

Subsequently, as shown in FIG. 9, the insulating film 8 is formed by CVD (Chemical Vapor Deposition) on the second surface 1b of the semiconductor substrate 1 including the inside of the first hole 7. The insulating film 8 is formed along the bottom surface and the side surface of the first hole 7 and the second surface 1b of the semiconductor substrate 1 so as to cover these surfaces. The insulating film 8 has a function to insulate the through silicon via described later and the semiconductor substrate 1. As the insulating film 8, for example, a silicon oxide film, a silicon nitride film or a polyimide resin is used.

Figure 10:
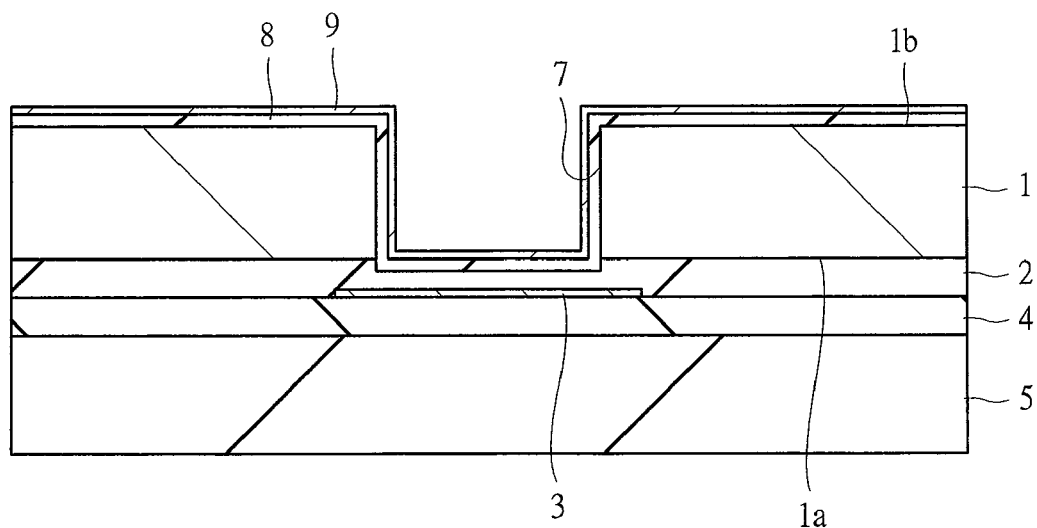
FIG. 10 is a cross-sectional view showing the manufacturing process of a semiconductor device continued from FIG. 9.

Next, as shown in FIG. 10, an aluminum film 9 is formed on the insulating film 8 formed on the second surface 1b of semiconductor substrate 1 including the inside of the first hole 7. The aluminum film 9 is the film provided to protect the insulating film 8, and it can be formed by, for example, the sputtering method or the deposition method.

Figure 11:
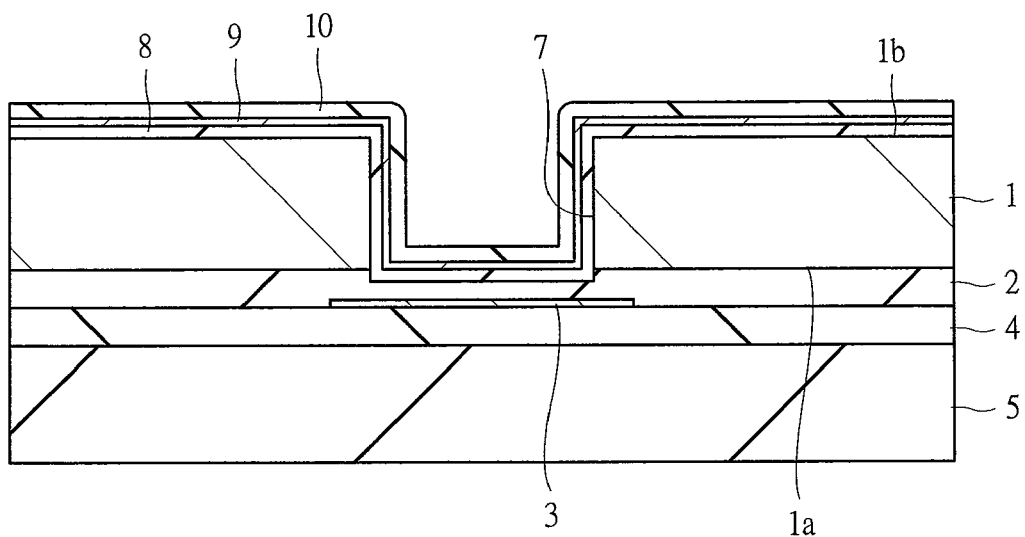
FIG. 11 is a cross-sectional view showing the manufacturing process of a semiconductor device continued from FIG. 10.

Subsequently, as shown in FIG. 11, a resist film 10 is coated on the aluminum film 9 formed on the second surface 1b of the semiconductor substrate 1 including the inside of the first hole 7. As the method of coating the resist film, for example, a coating method with spinner and a coating method with spray are known. In the case of the coating method with spinner, it is desirable to use the resist film 10 that can be coated to have the thickness of 5 μm to 30 μm in order to coat the resist film 10 along the bottom surface and the side surface of the first hole 7. Further, when air bubbles exist in the resist film 10, the exposure treatment by the photolithography technology becomes difficult, and the patterning failure occurs. Therefore, it is desirable to remove the air bubbles in the resist film 10 by the vacuum defoaming. In the case of the coating method with spray, different from the coating method with spinner, the resist film 10 is coated along the first hole 7.

Figure 12:
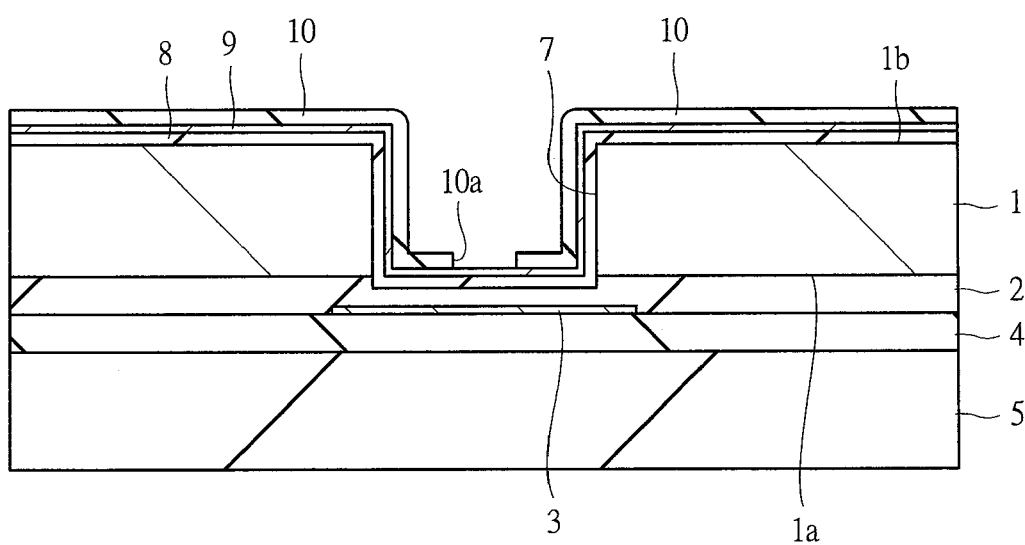
FIG. 12 is a cross-sectional view showing the manufacturing process of a semiconductor device continued from FIG. 11.

Thereafter, as shown in FIG. 12, the resist film 10 is patterned using the photolithography technology. The patterning of the resist film 10 is performed so as to form an opening 10a in the bottom surface of the first hole 7. The opening 10a is formed so as to have a diameter smaller than the diameter of the first hole 7. Then, the aluminum film 9 is exposed from the opening 10a.

Figure 13:
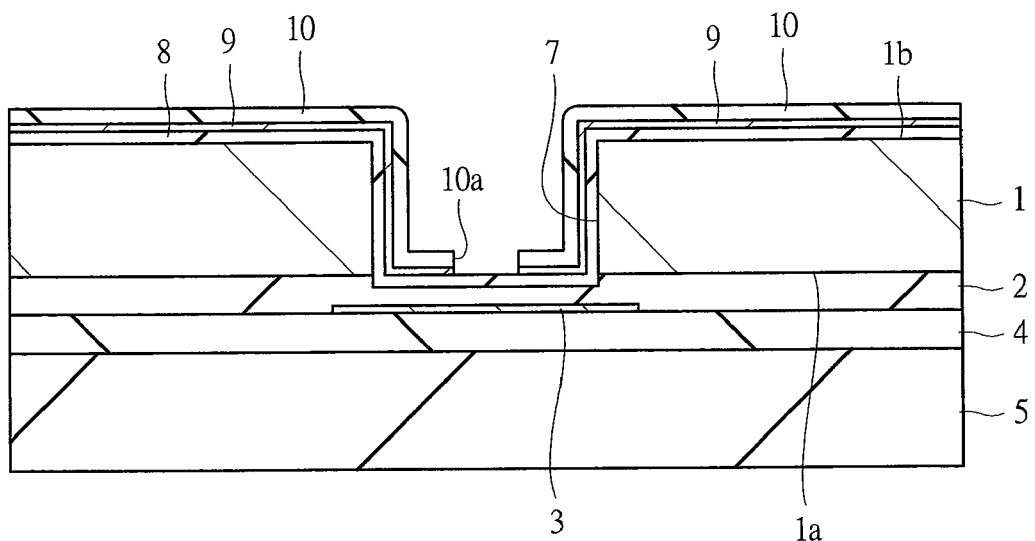
FIG. 13 is a cross-sectional view showing the manufacturing process of a semiconductor device continued from FIG. 12.

Next, as shown in FIG. 13, the aluminum film 9 exposed from the opening 10a formed in the resist film 10 is removed by etching. By this means, the insulating film 8 formed below the aluminum film 9 is exposed in the opening 10a. For the etching of the aluminum film 9, for example, etchant mainly containing phosphoric acid or diluted hydrofluoric acid can be used.

Figure 14:
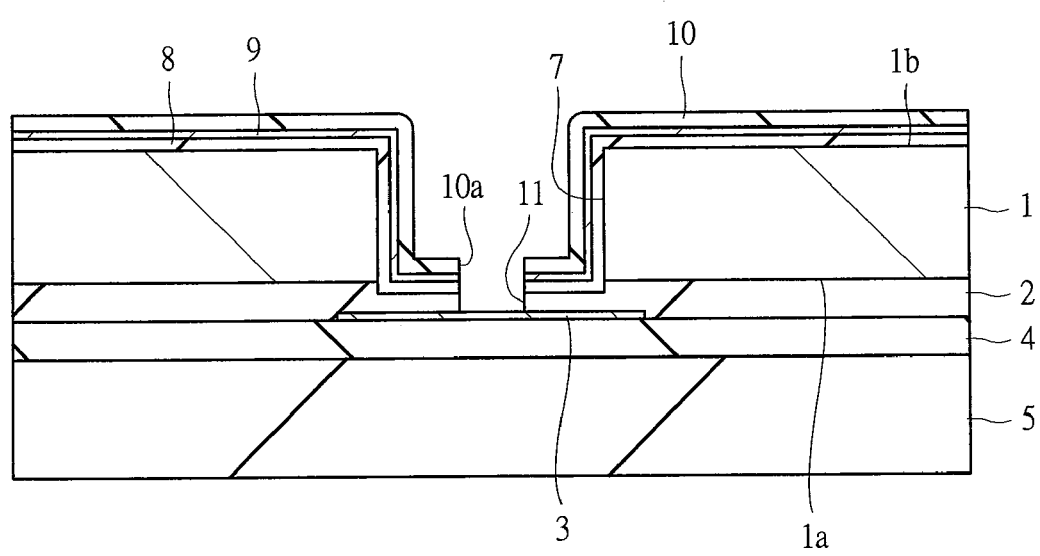
FIG. 14 is a cross-sectional view showing the manufacturing process of a semiconductor device continued from FIG. 13.

Subsequently, as shown in FIG. 14, the insulating film 8 exposed from the opening 10a and the interlayer insulating film 2 formed below the insulating film 8 are all removed by etching. By this means, the second hole 11 having the diameter smaller than that of the first hole 7 can be formed in the bottom surface of the first hole 7. The pad 3 is exposed on the bottom surface of the second hole 11. For the etching of the insulating film 8 and the interlayer insulating film 2, mixed gas mainly containing $CHF_3$ and $C_4H_8$ is used as the etching gas. In this etching process, the resist film 10 is etched to some extent.

In the first embodiment, as shown in FIG. 8, the first hole 7 is formed to the middle of the interlayer insulating film 2, by which the thickness of the interlayer insulating film 2 between the bottom surface of the first hole 7 and the pad 3 is reduced. Therefore, when the second hole 11 that reaches the pad 3 from the bottom surface of the first hole 7 is to be formed, the second hole 11 that reaches the pad 3 can be formed using the mask of the resist film 10 only once. In other words, the combined thickness of the interlayer insulating film 2 remaining between the bottom surface of the first hole 7 and the pad 3 and the insulating film 8 formed on the bottom surface of the first hole 7 can be set to the thickness capable of forming the second hole 11 before the resist film 10 of the first time used as a mask disappears when forming the second hole 11. By this means, the processing failure of the second hole 11 due to that the bottom surface of the second hole 11 is roughened in the processing of the interlayer insulating film 2 by the misalignment of the masks formed multiple times and the exposure in the lithography process cannot be performed appropriately can be prevented.

Figure 15:
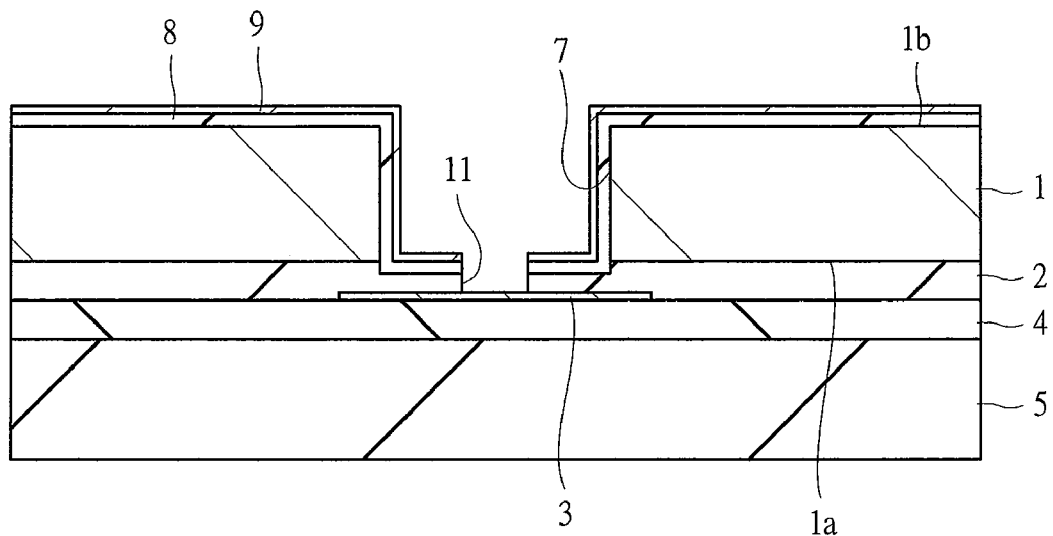
FIG. 15 is a cross-sectional view showing the manufacturing process of a semiconductor device continued from FIG. 14.
Figure 16:
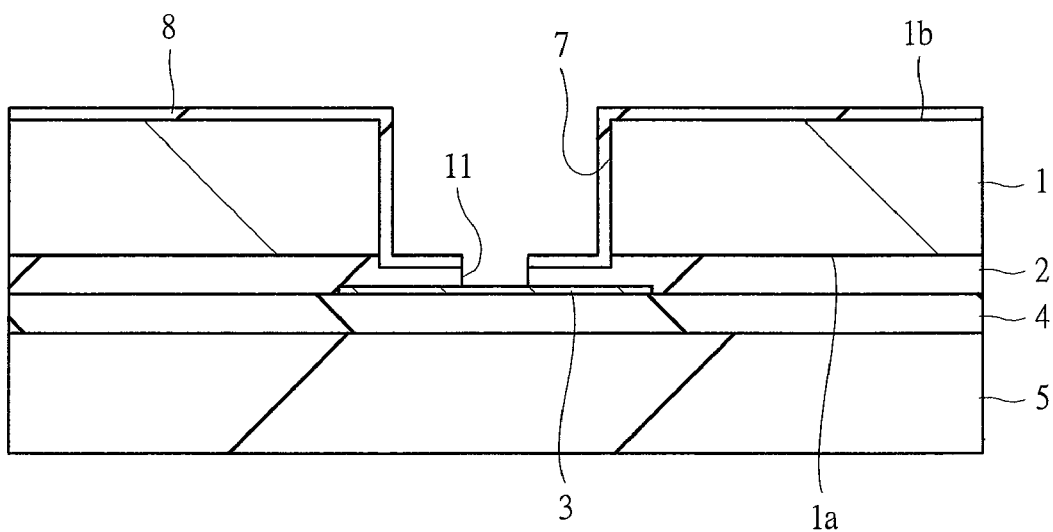
FIG. 16 is a cross-sectional view showing the manufacturing process of a semiconductor device continued from FIG. 15.

Next, as shown in FIG. 15, the patterned resist film 10 is removed. The removal of the resist film 10 is performed by the use of organic solvent or by oxygen ashing. Then, as shown in FIG. 16, the aluminum film 9 for protecting the insulating film formed below the resist film 10 is removed. At this time, although the pad 3 formed of an aluminum film is formed on the bottom surface of the second hole 11, the pad 3 is not etched because a barrier conductive film such as a titanium/titanium nitride film is usually formed on the surface of the pad 3.

Figure 17:
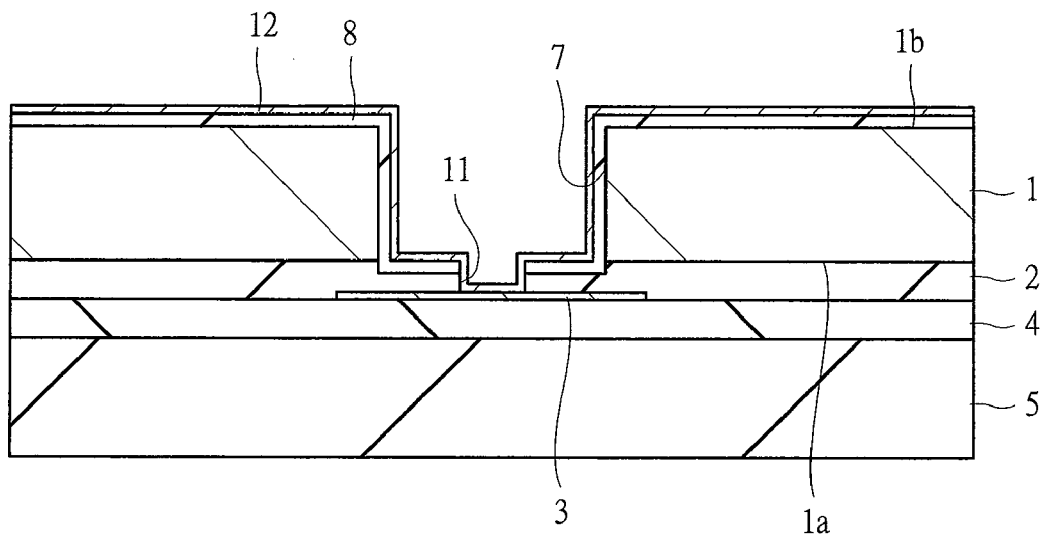
FIG. 17 is a cross-sectional view showing the manufacturing process of a semiconductor device continued from FIG. 16.

Subsequently, as shown in FIG. 17, the seed layer 12 is formed on the side surface and the bottom surface of the second hole 11, on the bottom surface and the side surface of the first hole 7 via the insulating film 8, and on the second surface 1b of the semiconductor substrate 1 via the insulating film 8. The seed layer 12 can be formed by using, for example, the sputtering method. As the seed layer 12, a stacked film including a titanium film (Ti film) and a gold film (Au film) can be used. At this time, the titanium film is formed to have the thickness of about 0.02 μm to 0.3 μm so as to secure the adhesiveness between the insulating film 8 and the gold film, and the gold film is desirably formed to have the thickness of about 0.3 μm to 2 μm as an underlying film (electrode film) of the plating film. Other than the stacked film of a titanium film and a gold film, a stacked film of a chromium film (Cr film) and a gold film can be used as the seed layer 12.

Figure 18:
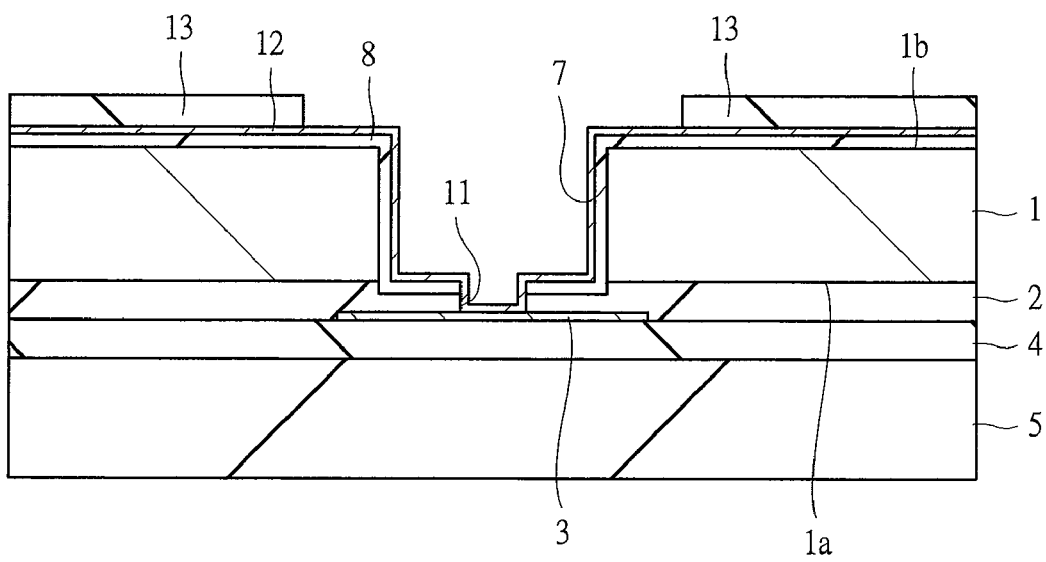
FIG. 18 is a cross-sectional view showing the manufacturing process of a semiconductor device continued from FIG. 17.

Next, as shown in FIG. 18, after coating a resist film 13, the resist film 13 is patterned by using the photolithography technology. The patterning is performed so as to expose the first hole 7, the second hole 11 and a wiring formation region on the second surface 1b of the semiconductor substrate 1.

Figure 19:
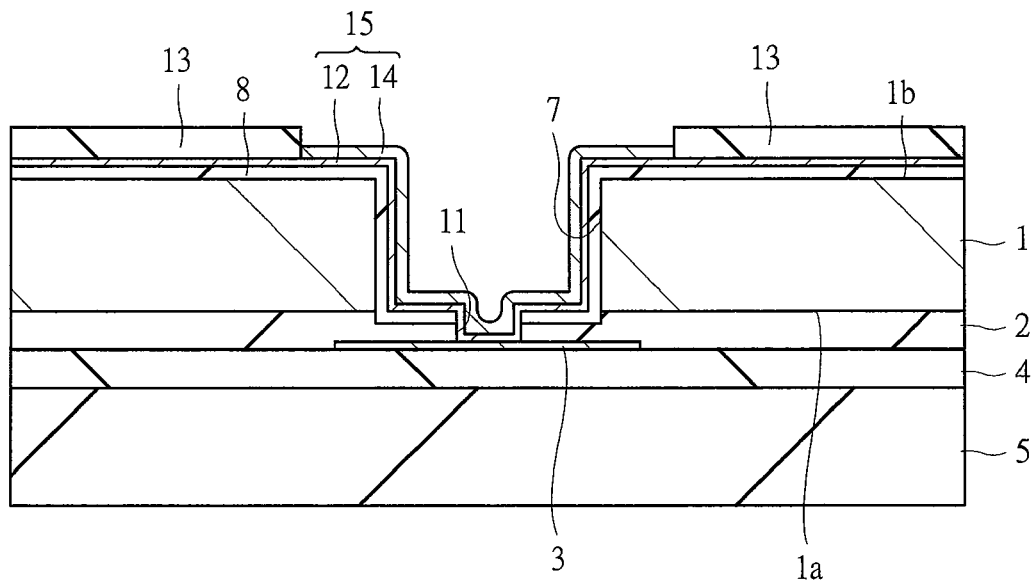
FIG. 19 is a cross-sectional view showing the manufacturing process of a semiconductor device continued from FIG. 18.

Subsequently, as shown in FIG. 19, the plating film 14 is formed on the seed layer 12 exposed from the patterned resist film 13. The plating film 14 can be formed by, for example, electrolytic plating method. In this manner, the conductive film 15 including the seed layer 12 and the plating film 14 can be formed in the first hole 7 and the second hole 11 and on the wiring formation region on the second surface 1b of the semiconductor substrate 1. Although the thickness of the plating film 14 is desirably set to 1 μm or more in consideration of the electric resistance, since the inner diameter of the through silicon via is determined by the thickness of the plating film 14, the thickness of the plating film 14 is adjusted so that the through silicon via has a predetermined inner diameter. The plating film 14 is formed of, for example, a gold film and can be formed by the electroless plating method and the sputtering method other than the electrolytic plating method. Note that, although a stacked film of a gold film and a copper film (Cu film) can be used as the plating film 14 other than a gold film, a gold film is desirably used for the surface of the plating film 14 from the viewpoint of the SiP structure to stack the semiconductor chips.

Figure 20:
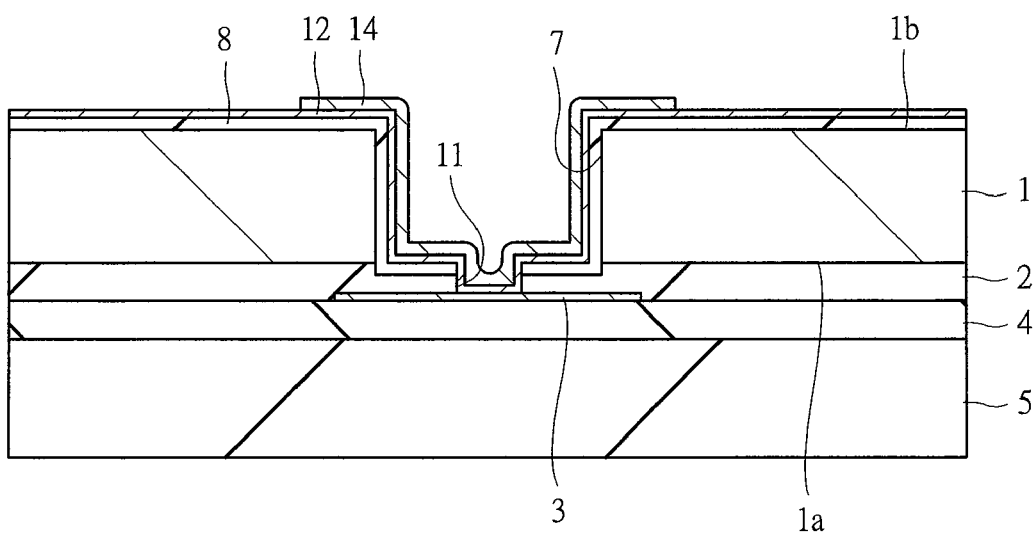
FIG. 20 is a cross-sectional view showing the manufacturing process of a semiconductor device continued from FIG. 19.
Figure 21:
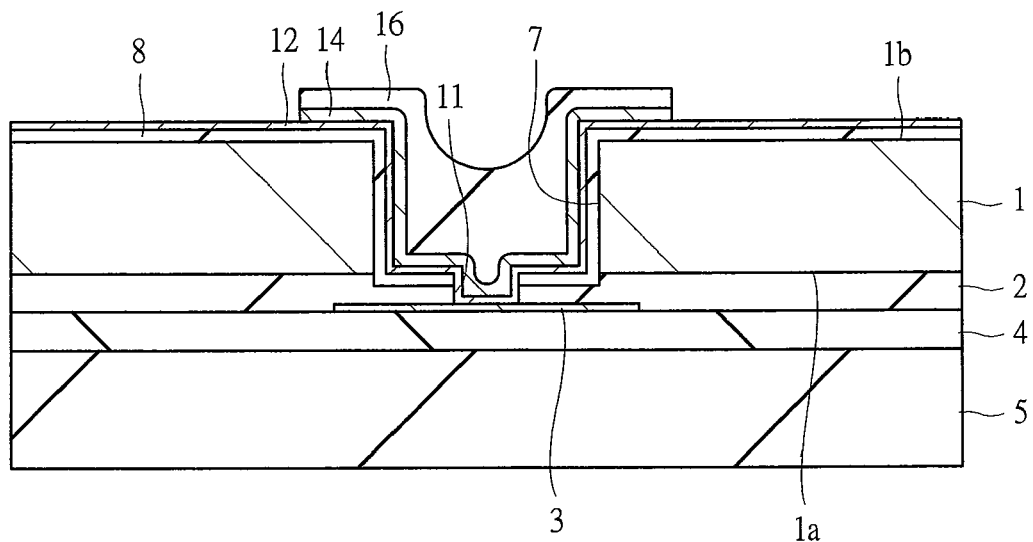
FIG. 21 is a cross-sectional view showing the manufacturing process of a semiconductor device continued from FIG. 20.

Thereafter, as shown in FIG. 20, the resist film 13 is removed by the use of the organic solvent or oxygen ashing. Then, as shown in FIG. 21, after coating a resist film 16 on the second surface 1b of the semiconductor substrate 1, the resist film 16 is patterned by the photolithography technology. The patterning of the resist film 16 is performed so as to cover the first hole 7, the second hole 11 and the wiring formation region formed on the second surface 1b of the semiconductor substrate 1.

Figure 22:
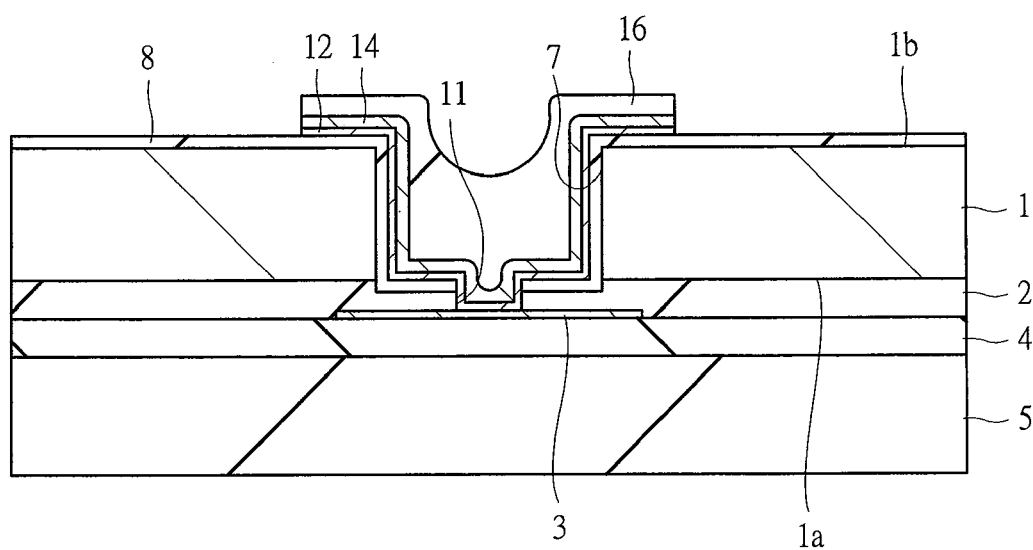
FIG. 22 is a cross-sectional view showing the manufacturing process of a semiconductor device continued from FIG. 21.

Next, as shown in FIG. 22, the seed layer 12 exposed from the patterned resist film 16 is removed. Since the seed layer 12 is formed of a stacked film of a titanium film and a gold film, these films are respectively removed using the etching solution for a titanium film and the etching solution for a gold film. As the etching solution for a gold film, for example, a mixture of iodine and ammonium iodide can be used, and as the etching solution for a titanium film, for example, hydrofluoric acid can be used. However, any other etching solutions can be used as long as the etching can be performed appropriately.

Figure 23:
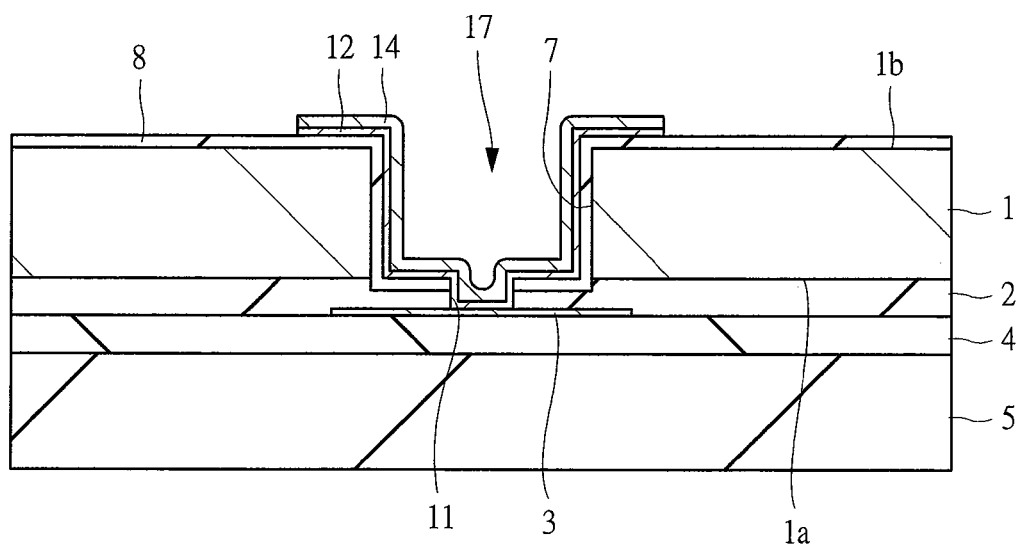
FIG. 23 is a cross-sectional view showing the manufacturing process of a semiconductor device continued from FIG. 22.
Figure 24:
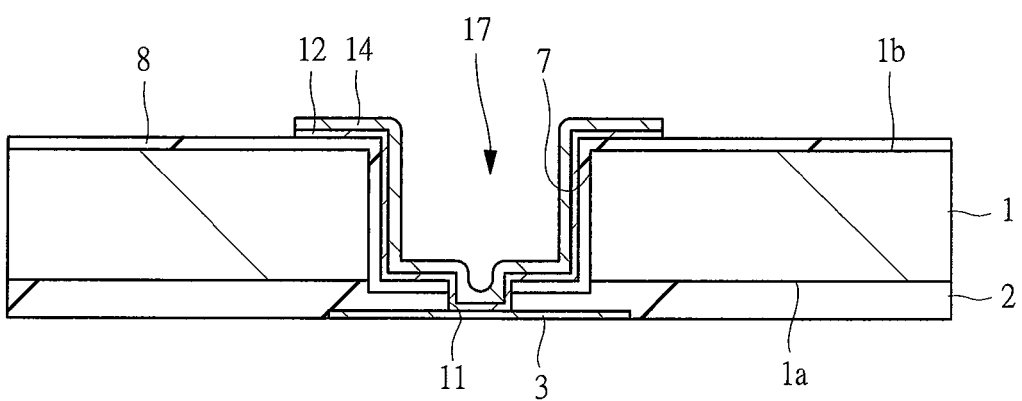
FIG. 24 is a cross-sectional view showing the manufacturing process of a semiconductor device continued from FIG. 23.

Subsequently, as shown in FIG. 23, by removing the patterned resist film 16, the process for the semiconductor substrate 1 in a state of a semiconductor is finished. In this manner, the through silicon via 17 to be connected to the pad 3 can be formed. Also, as shown in FIG. 24, the supporting substrate 5 supporting the semiconductor substrate 1 is detached. For example, if the adhesion layer 4 adhering the semiconductor substrate 1 and the supporting substrate 5 has a thermoplastic character, the semiconductor substrate 1 and the supporting substrate 5 are detached by heating the semiconductor substrate 1. After the semiconductor substrate 1 is detached from the supporting substrate 5, the semiconductor substrate 1 in a state of a semiconductor wafer is diced into pieces of semiconductor chips. The dicing into pieces of semiconductor chips can be performed in a state where the semiconductor substrate 1 is stuck onto the supporting substrate 5, but the supporting substrate 5 is also cut off in such a case, and the supporting substrate 5 cannot be reused. Thus, although the handling (transportation) of the semiconductor substrate 1 is difficult because the semiconductor substrate 1 is thin when the semiconductor substrate 1 is detached from the supporting substrate 5, the reuse of the supporting substrate 5 is enabled by dicing the semiconductor substrate 1 after detaching from the supporting substrate 5.

Figure 25:
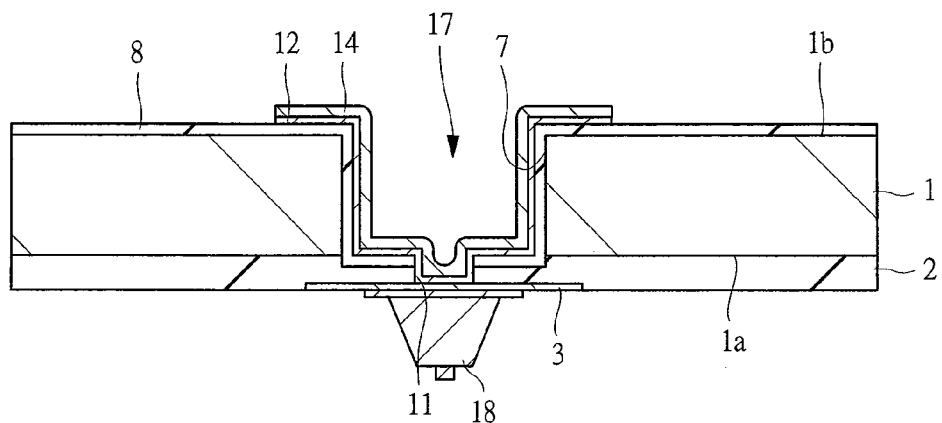
FIG. 25 is a cross-sectional view showing the manufacturing process of a semiconductor device continued from FIG. 24.

Finally, as shown in FIG. 25, the stud bump electrode 18 is formed by, for example, a stud bump method on the pad 3 formed on the surface of the interlayer insulating film 2 in the piece of the semiconductor chip. As a formation method of the bump electrode, the solder paste bump method, the plating method or the deposition method can be used.

In the manner as described above, the semiconductor chip in the first embodiment can be formed. According to the first embodiment, the first hole 7 is formed beyond the semiconductor substrate 1 made of silicon to the middle of the interlayer insulating film 2, thereby reducing the thickness of the interlayer insulating film 2 between the bottom surface of the first hole 7 and the pad 3. Accordingly, when forming the second hole 11 reaching the pad 3 from the bottom surface of the first hole 7, the processing thereof is facilitated because the thickness of the interlayer insulating film 2 is reduced.

More specifically, when the second hole 11 reaching the pad 3 from the bottom surface of the first hole 7 is to be formed in the interlayer insulating film 2, the number of times of the formation of the resist mask to form the opening in the interlayer insulating film 2 can be reduced. By this means, the processing failure of the interlayer insulating film 2 due to the misalignment of the masks formed multiple times can be reduced, and in a plurality of through silicon vias 17 each having the first hole 7 and the second hole 11 as a penetration space, the uniform processing of the through silicon vias 17 can be enabled owing to the reduction in thickness of the interlayer insulating film 2.

As a result, the reliability of the through silicon via 17 can be improved, and the manufacturing yield of a semiconductor device can be improved. Further, since the connection variations between the second hole 11 and the pad 3 due to the processing failure of the interlayer insulating film 2 can be suppressed, the variation in the connection resistance between the through silicon via 17 and the pad 3 can be suppressed.

Further, since the processing variations can be reduced in the process of forming the through silicon via 17, the process margin is increased and the manufacturing yield of a semiconductor device is improved.

Furthermore, since the first hole 7 with a large diameter is not formed to reach the pad 3, but the second hole 11 with a diameter smaller than that of the first hole 7 is formed to connect to the pad 3, the interlayer insulating film 2 which supports the pad 3 can be left more and the decrease in strength of the pad 3 can be suppressed. More specifically, the reliability when the stud bump electrode 18 is formed on the pad 3 can be improved.

In the first embodiment, when forming the second hole 11 reaching the pad 3 from the bottom surface of the first hole 7, since the thickness of the interlayer insulating film 2 is reduced, the processing thereof can be facilitated. Therefore, the effect that the manufacturing yield can be improved in the forming process of the second hole 11 can be achieved. On the other hand, since the thickness of the interlayer insulating film 2 between the first hole 7 and the pad 3 is reduced, there is the fear that the strength of the interlayer insulating film 2 that supports the pad 3 decreases. However, even if the thickness of the interlayer insulating film 2 is reduced in the manner as described in the first embodiment, the decrease in strength of the pad 3 can be suppressed when the thickness of the conductive film 15 formed on the bottom surface and the side surface of the second hole 11, the combined thickness of the interlayer insulating film 2 and the insulating film 8 formed on the first hole 7 and the hole diameter of the second hole 11 satisfy a predetermined relation, and the stud bump electrode 18 can be appropriately formed on the pad 3, which will be described below.

Figure 26:
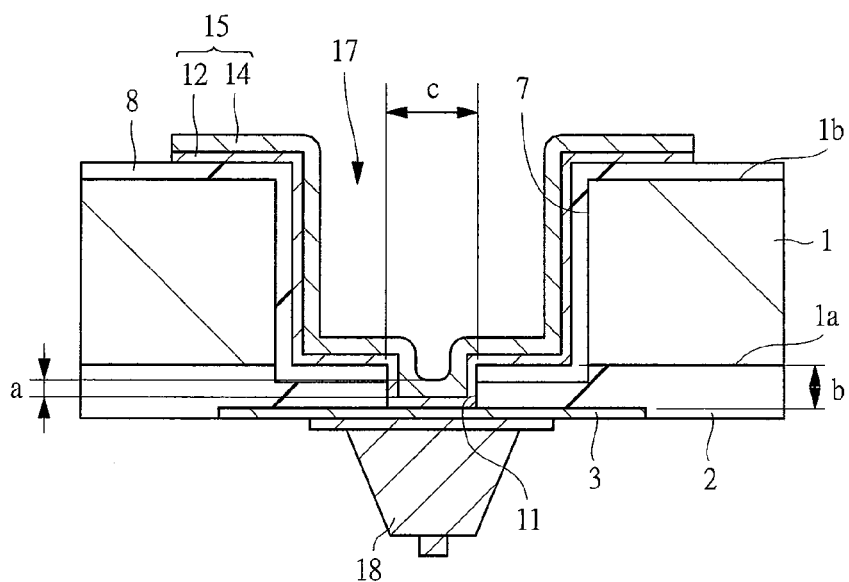
FIG. 26 is a cross-sectional view showing the semiconductor chip in the first embodiment, in which dimensions of predetermined portions are represented as variables.

FIG. 26 is a cross-sectional view showing the semiconductor chip in this first embodiment, and dimensions of predetermined portions are represented as variables. Specifically, the thickness of the conductive film 15 (combined thickness of plating film 14 and seed layer 12) formed on the bottom surface and the side surface of the second hole 11 is defined as a, and the thickness of a film (referred to as a bottom insulating film) obtained by combining the interlayer insulating film 2 between the first hole 7 and the pad 3 and the insulating film 8 formed on the bottom surface of the first hole 7 is defined as b. Further, a hole diameter of the second hole 11 is defined as c.

Figure 27:
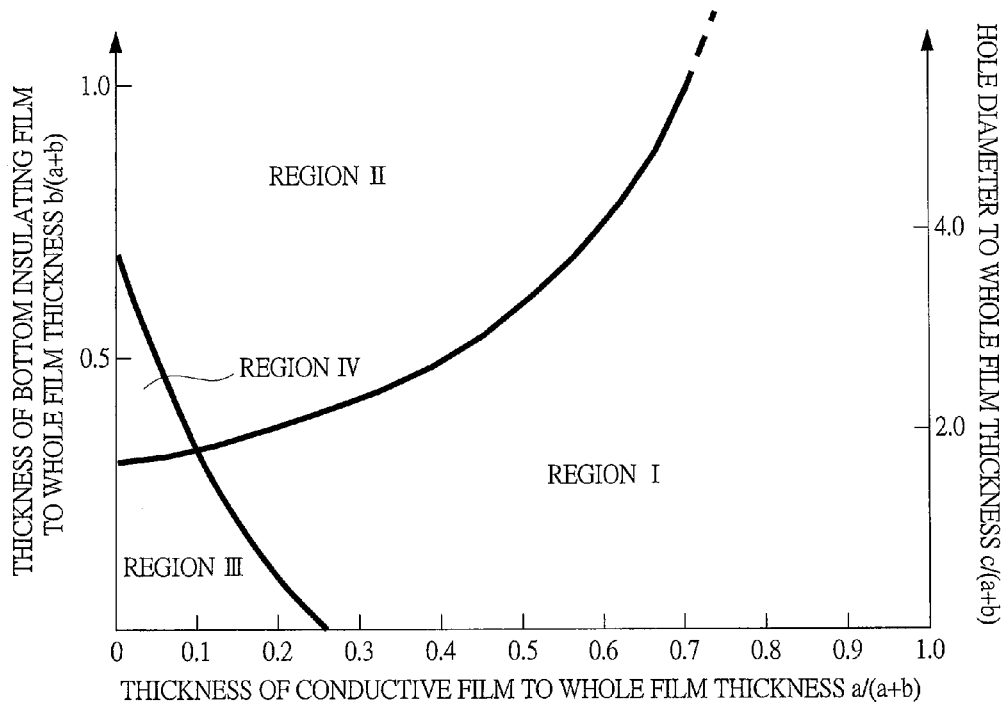
FIG. 27 is a graph showing predetermined relations using the dimensions shown in FIG. 26.

FIG. 27 is a graph showing the relation of the variables a, b, and c shown in FIG. 26. In FIG. 27, the horizontal axis represents the film thickness (a) of the conductive film 15 to the whole film thickness (a+b). Also, the vertical axis (left side) represents the film thickness (b) of the bottom insulating film (interlayer insulating film 2 and insulating film 8) to the whole film thickness (a+b), and the vertical axis (right side) represents the hole diameter (c) of the second hole 11 to the whole film thickness (a+b). As is understood from FIG. 27, there are four regions (region I to region IV) including the region in which the stud bump electrode 18 can be normally formed on the pad 3 and the regions in which the stud bump electrode 18 cannot be normally formed on the pad 3 classified by means of the variables a, b and c. Note that, since the thickness of the pad 3 is determined by a design rule, it is regarded as a constant film thickness in FIG. 27.

Figure 28:
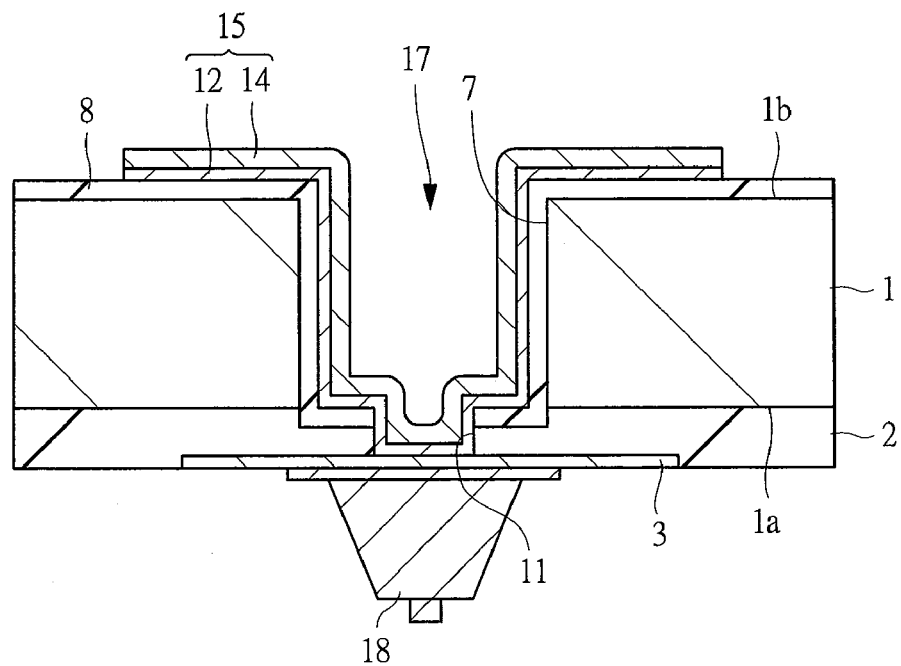
FIG. 28 is a cross-section view showing a structure of the semiconductor chip included in region I shown in FIG. 27.

First, the region I will be described. FIG. 28 is a drawing showing a structure of a semiconductor chip in the case where the relation of the variables a, b and c is included in the region I. FIG. 28 shows that the thickness a of the conductive film 15 is sufficiently large with respect to the hole diameter c of the second hole 11 and the thickness b of the bottom insulating film is sufficient to maintain the strength of the pad 3. Thus, it can be understood that the stud bump electrode 18 can be normally formed on the pad 3 in the structure included in the region I.

Figure 29:
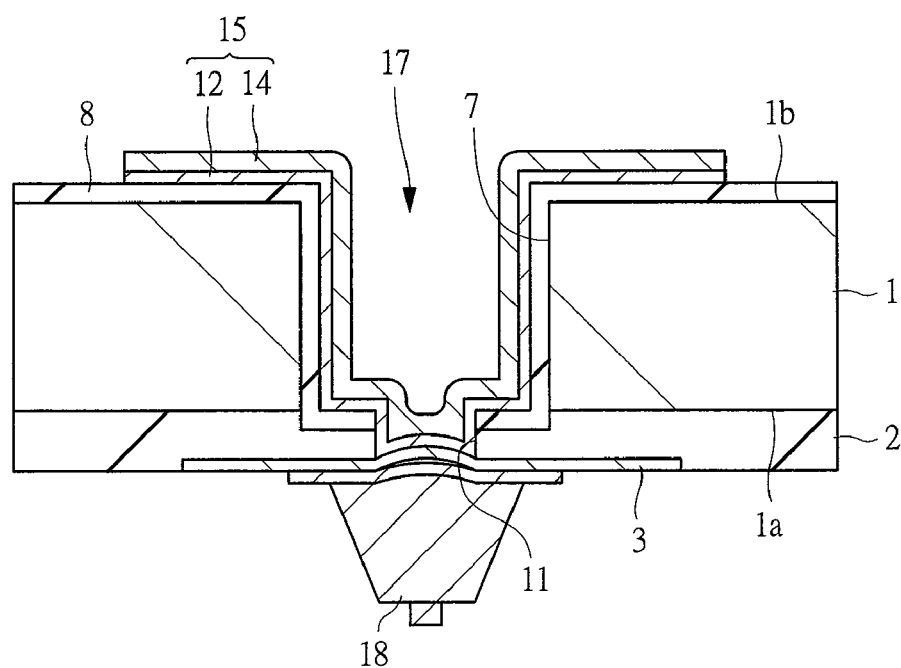
FIG. 29 is a cross-section view showing a structure of the semiconductor chip included in region II shown in FIG. 27.

Subsequently, the region II will be described. FIG. 29 is a drawing showing a structure of a semiconductor chip in the case where the relation of the variables a, b and c is included in the region II. In the structure of the semiconductor chip shown in FIG. 29, the thickness b of the bottom insulating film is sufficient to maintain the strength of the pad 3, but the thickness a of the conductive film 15 is small with respect to the hole diameter c of the second hole 11. Accordingly, when the stud bump electrode 18 is pushed onto the pad 3, the conductive film 15 is deformed, and an electrical connection between the stud bump electrode 18 and the conductive film 15 fails. Thus, it can be understood that the stud bump electrode 18 cannot be normally formed on the pad 3 in the structure included in the region II.

Figure 30:
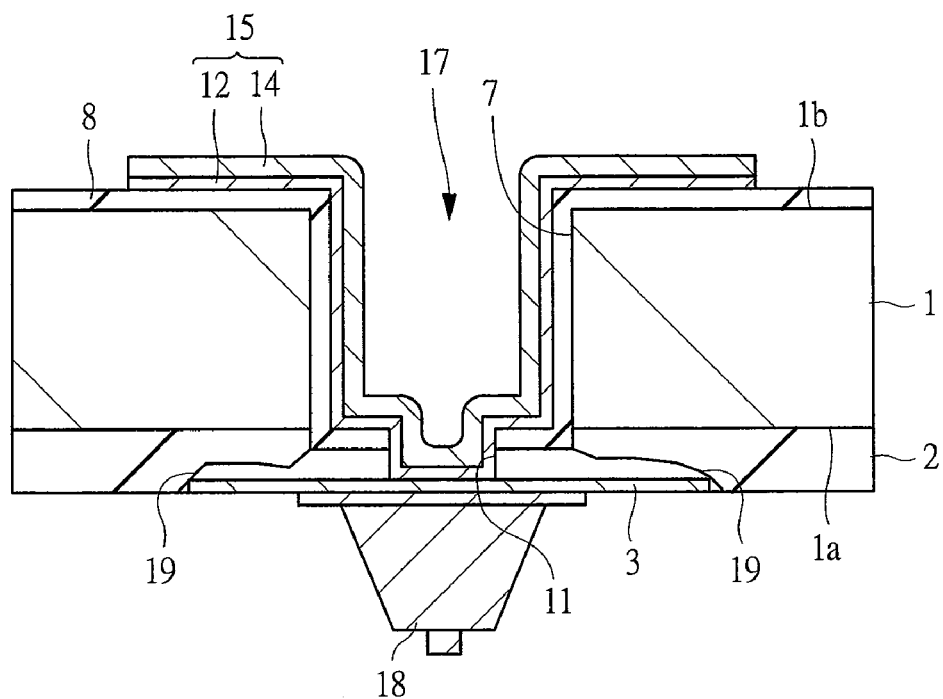
FIG. 30 is a cross-section view showing a structure of the semiconductor chip included in region III shown in FIG. 27.

Next, the region III will be described. FIG. 30 is a drawing showing a structure of a semiconductor chip in the case where the relation of the variables a, b and c is included in the region III. In the structure of the semiconductor chip shown in FIG. 30, the thickness a of the conductive film 15 is sufficiently large with respect to the hole diameter c of the second hole 11, but the thickness b of the bottom insulating film is small. Accordingly, when the stud bump electrode 18 is pushed onto the pad 3, the support of the pad 3 by the bottom insulating film is insufficient and cracks 19 occur in the interlayer insulating film 2 constituting the bottom insulating film. Thus, it can be understood that the stud bump electrode 18 cannot be normally formed on the pad 3 in the structure included in the region III.

Figure 31:
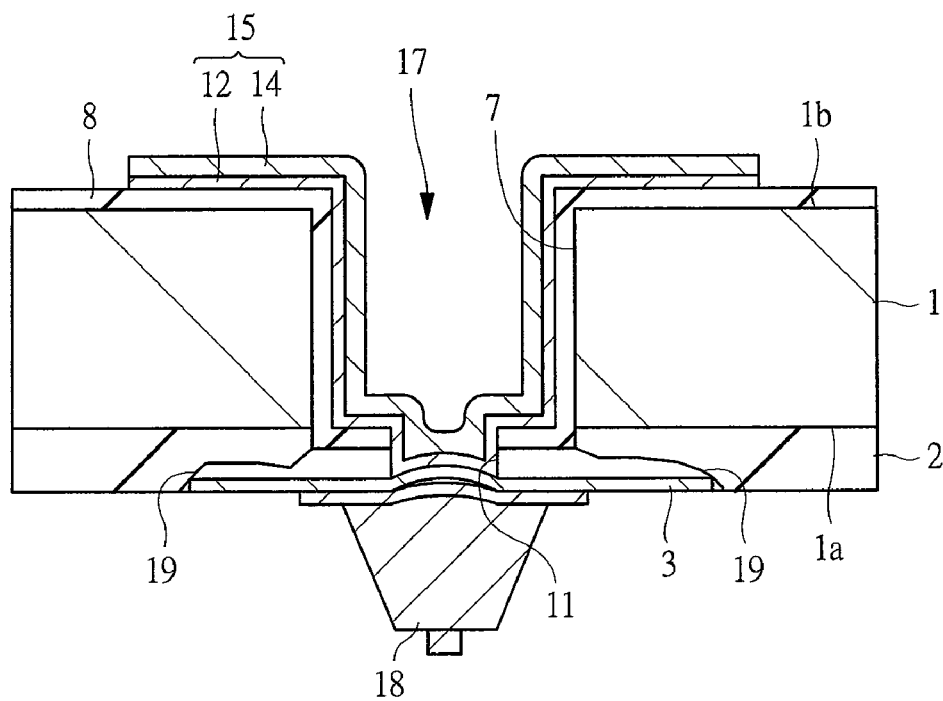
FIG. 31 is a cross-section view showing a structure of the semiconductor chip included in region IV shown in FIG. 27.

Next, the region IV will be described. FIG. 31 is a drawing showing a structure of a semiconductor chip in the case where the relation of the variables a, b and c is included in the region IV. In the structure of the semiconductor chip shown in FIG. 31, the thickness a of the conductive film 15 is small with respect to the hole diameter c of the second hole 11, and the thickness b of the bottom insulating film is also small. Accordingly, when the stud bump electrode 18 is pushed onto the pad 3, the conductive film 15 is deformed, and an electrical connection between the stud bump electrode 18 and the conductive film 15 fails, and the support of the pad 3 by the bottom insulating film is insufficient and cracks 19 occur in the interlayer insulating film 2 constituting the bottom insulating film. Thus, it can be understood that the stud bump electrode 18 cannot be normally formed on the pad 3 in the structure included in the region IV.

As is evident from above, in order to normally form the stud bump electrode 18 on the pad 3, it is necessary to set the relation of the variables a, b and c within the region I. Therefore, in the first embodiment, by forming the first hole 7 beyond the semiconductor substrate 1 made of silicon to the middle of the interlayer insulating film 2, the thickness of the interlayer insulating film 2 between the bottom surface of the first hole 7 and the pad 3 is reduced, and the dimensions of respective portions are determined so that the relation of the variables a, b and c is included within the region I. By this means, the forming process of the second hole 11 can be facilitated, and sufficient strength of the pad 3 can be maintained and the stud bump electrode 18 can be normally formed on the pad 3. Specifically, as is understood from FIG. 27, when the thickness of the conductive film 15 formed on the pad 3 which is the bottom surface of the second hole 11 is defined as a and the combined thickness of the interlayer insulating film 2 between the bottom surface of the first hole 7 and the pad 3 and the insulating film 8 formed on the bottom surface of the first hole 7 is defined as b, the strength of the pad 3 can be sufficiently secured by forming the structure in which the value of a/(a+b) is at least 0.11 or more.

Figure 32:
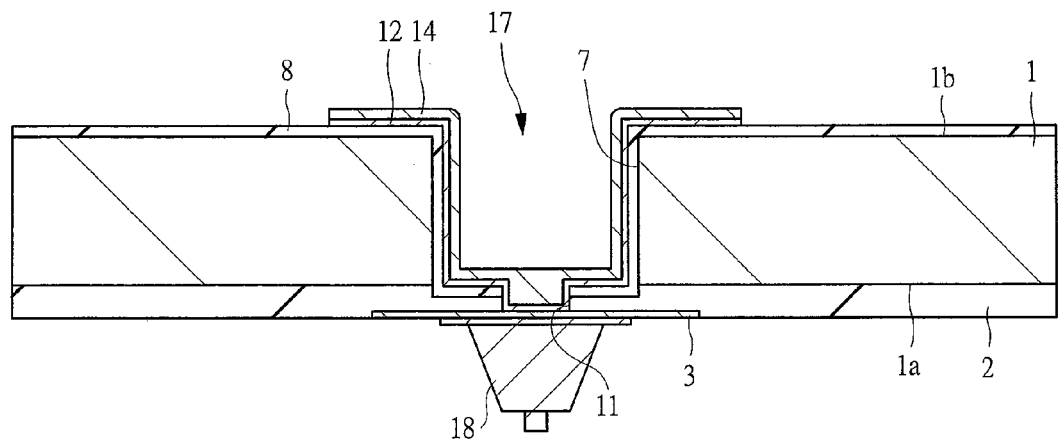
FIG. 32 is a cross-sectional view showing a semiconductor device in a modified example of the first embodiment.

Here, the structure in which the conductive film 15 is formed on the bottom surface and the side surface of the second hole 11 and the second hole 11 has a hollow therein as shown in FIG. 26 has been described in the first embodiment. However, as shown in FIG. 32, the conductive film 15 can be formed so as to fill the inside of the second hole 11 with a small hole diameter by increasing the thickness of the conductive film 15. In this case, since the pad 3 is supported by the conductive film 15 embedded in the second hole 11 together with the interlayer insulating film 2, the decrease in strength of the pad 3 can be further suppressed. At this time, the hole 7 with a diameter larger than that of the second hole 11 of course has a hollow therein for inserting the stud bump electrode 18 formed in another semiconductor chip.

Second Embodiment

Although the semiconductor chip in which a highly integrated circuit is formed like a microcomputer chip has been described in the first embodiment, a semiconductor chip for performing the rewiring like an interposer chip will be described in the second embodiment.

For example, when a plurality of semiconductor chips are three-dimensionally stacked, a stud bump electrode formed in a semiconductor chip disposed above is deformed and inserted into a through silicon via formed in a semiconductor chip disposed below, thereby electrically connecting the upper and lower semiconductor chips. At this time, respectively different integrated circuits are formed in the semiconductor chip disposed above and the semiconductor chip disposed below, and they have different functions in many cases. Thus, the upper and lower semiconductor chips have different layout patterns, respectively. Accordingly, the position of the through silicon via of the semiconductor chip disposed below and the position of the stud bump electrode of the semiconductor chip disposed above do not always coincide with each other. The semiconductor chip inserted between the upper and lower semiconductor chips in such a case is an interposer chip. More specifically, in the interposer chip, a through silicon via is formed at a position corresponding to the position of the stud bump electrode of the semiconductor chip disposed above, and the semiconductor chip disposed above and the interposer chip are connected. Then, in the interposer chip, wiring to be connected to the through silicon via described above is formed, and the stud bump electrode to be connected to this wiring is formed at a position where the through silicon via of the lower semiconductor chip is formed. By this means, the stud bump electrode formed in the interpose chip is connected to the through silicon via formed in the lower semiconductor chip. In this manner, even if the position of the stud bump electrode formed in the semiconductor chip disposed above does not coincide with the position of the through silicon via formed in the semiconductor chip disposed below, the upper and lower semiconductor chips can be electrically connected by interposing an interposer chip between the upper and lower semiconductor chips.

Figure 33:
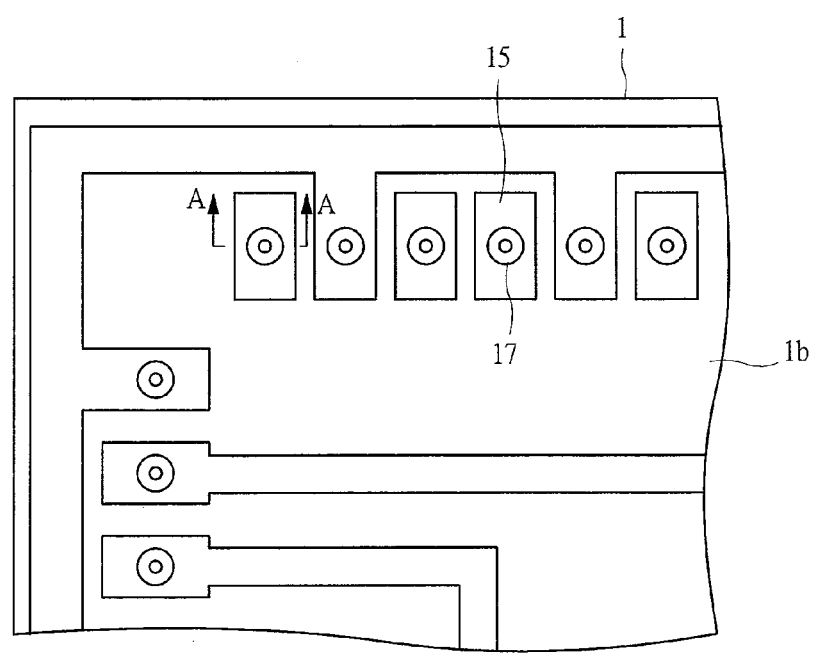
FIG. 33 is a plan view showing a part of a semiconductor chip in the second embodiment.

Next, a structure of an interposer chip will be described with reference to accompanying drawings. The structure of the interposer chip in the second embodiment is approximately similar to that of the semiconductor chip in the first embodiment. FIG. 33 is a plan view showing the semiconductor chip in the second embodiment. In FIG. 33, a part of the semiconductor chip is seen from above the second surface (rear surface) 1b of the semiconductor substrate 1. As shown in FIG. 33, the semiconductor chip is constituted of the semiconductor substrate 1 with a rectangular shape, and a plurality of through silicon vias 17 are formed on the second surface 1b of the semiconductor substrate 1. Also, the plurality of through silicon vias 17 are connected to the wirings formed of the conductive film 15, respectively, and the wiring pattern is formed by these wirings on the second surface 1b of the semiconductor substrate 1.

Figure 34:
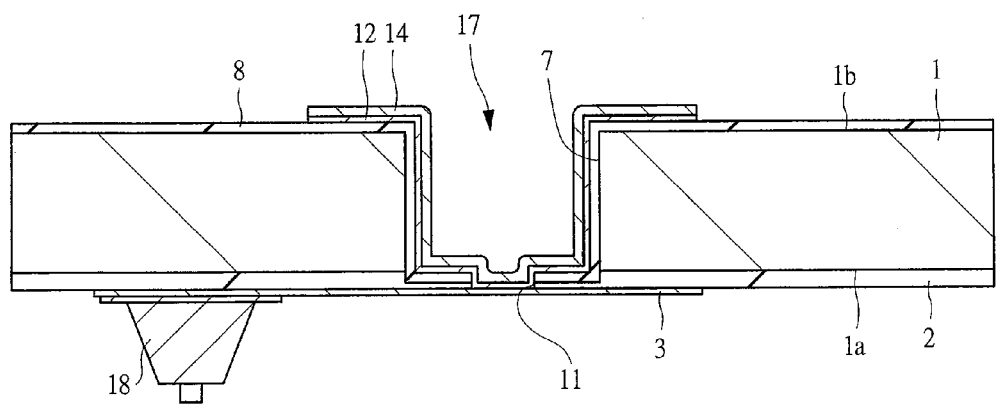
FIG. 34 is a cross-sectional view showing a cross section taken along the line A-A in FIG. 33.

FIG. 34 is a cross-sectional view showing the cross section taken along the line A-A in FIG. 33. As shown in FIG. 34, the difference between the semiconductor chip in the second embodiment and the semiconductor chip in the first embodiment shown in FIG. 2 lies in that the position where the through silicon via 17 is formed does not correspond to the position opposed to the position where the stud bump electrode 18 is formed in the second embodiment. This makes it possible to electrically connect the upper and lower semiconductor chips by interposing the interposer chip in the second embodiment between the upper and lower semiconductor chips even if the position of the stud bump electrode formed in the semiconductor chip disposed above does not coincide with the position of the through silicon via formed in the semiconductor chip disposed below. The through silicon via 17 and the stud bump electrode 18 are electrically connected by the pad 3 and the wirings. However, the position where the through silicon via 17 is formed sometimes coincides with the position where the stud bump electrode 18 is formed.

Further, the difference between the semiconductor chip in which a highly integrated circuit is formed like a microcomputer chip and the interposer chip lies in the thickness of the interlayer insulating film 2. In the semiconductor chip in which a highly integrated circuit is formed like a microcomputer chip, many wirings are formed and the thickness of the interlayer insulating film 2 is increased. On the other hand, since the purpose of the interposer chip in the second embodiment is the rewiring, the wiring formed in the interlayer insulating film 2 is a single layer, and the interlayer insulating film 2 tends to have a relatively small thickness. Other structure is approximately similar to that of the first embodiment.

Figure 35:
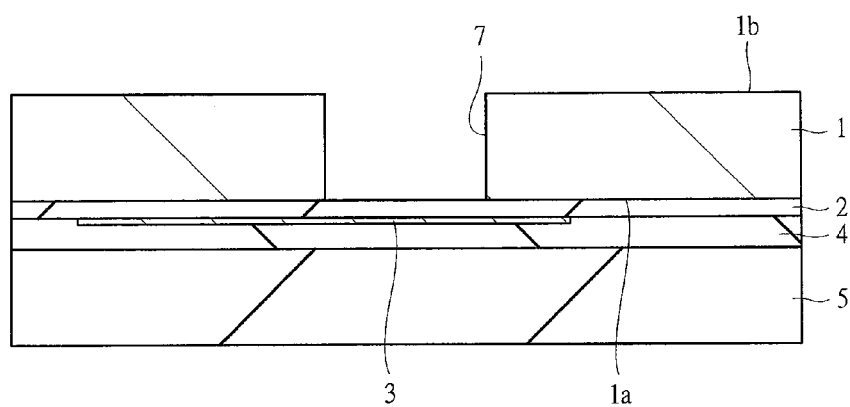
FIG. 35 is a cross-sectional view showing a manufacturing process of a semiconductor device in the second embodiment.
Figure 36:
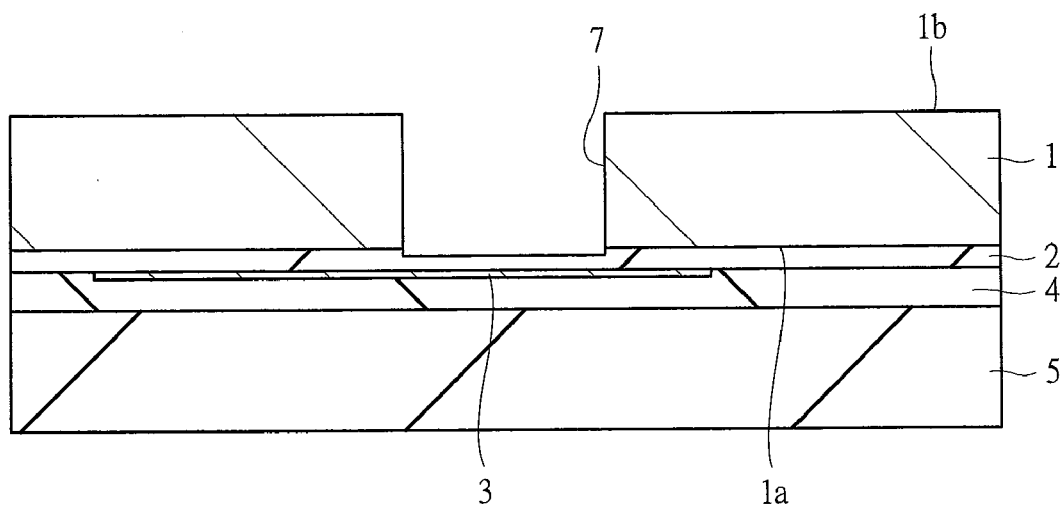
FIG. 36 is a cross-sectional view showing the manufacturing process of a semiconductor device continued from FIG. 35.

The interposer chip in the second embodiment has the structure as described above, and the manufacturing method thereof will be described below. The manufacturing method in the second embodiment is also similar to that of the first embodiment, and the characteristic point thereof will be mainly described. The first hole 7 which reaches the interlayer insulating film 2 from the second surface 1b of the semiconductor substrate 1 is formed in the manner as shown in FIG. 3 to FIG. 7. Thereafter, as shown in FIG. 35, the resist film 6 formed on the second surface 1b of the semiconductor substrate 1 is removed. Here, in the second embodiment, although the thickness of the interlayer insulating film 2 is smaller than that of the first embodiment, from the viewpoint of facilitating the process of the second hole, for example, the interlayer insulating film 2 exposed on the bottom surface of the first hole 7 may be etched to the middle with using the semiconductor substrate 1 made of silicon and the first hole 7 formed in the semiconductor substrate 1 as a mask as shown in FIG. 36. More specifically, the second embodiment may include the process similar to that of the first embodiment.

Figure 37:
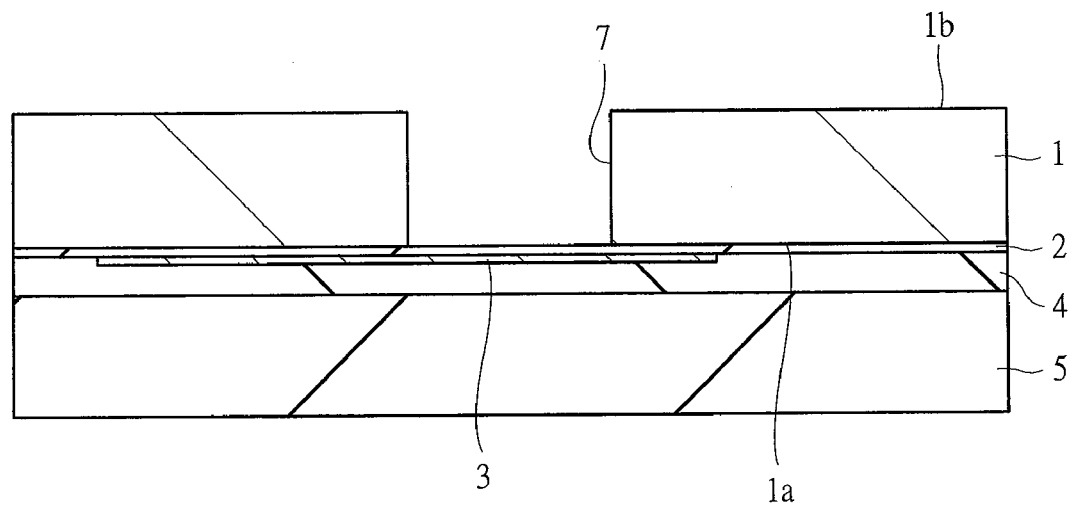
FIG. 37 is a cross-sectional view showing a manufacturing process of a semiconductor device in a modified example of the second embodiment.

On the other hand, in the second embodiment, if the thickness of the interlayer insulating film 2 is sufficiently small and it does not cause any problem in the process of the second hole, the etching of the interlayer insulating film 2 is not always necessary as shown in FIG. 37.

Thereafter, the process shown in FIG. 9 to FIG. 24 is performed. Then, as shown in FIG. 34, the stud bump electrode is formed at the position different from the position opposed to the through silicon via 17. However, the stud bump electrode 18 is formed at the position opposed to the through silicon via 17 in some cases. In this manner, the interposer chip in the second embodiment can be formed. According to the second embodiment, since the interlayer insulating film 2 is sufficiently thin, after the first hole 7 is formed in the semiconductor substrate 1 made of silicon, it is not always necessary to etch the interlayer insulating film 2 exposed on the bottom surface of the first hole 7. However, from the viewpoint of facilitating the process of the second hole 11, that is, when the thickness of the interlayer insulating film is so large that the second hole 11 cannot be formed by one photolithography process, the interlayer insulating film 2 exposed on the bottom surface of the first hole 7 is desirably etched to the middle, thereby further reducing the thickness of the interlayer insulating film 2. As described above, the present invention can be flexibly modified in accordance with the thickness of the interlayer insulating film 2 formed on the semiconductor substrate 1. Note that the second embodiment can achieve the effect similar to the first embodiment.

Third Embodiment

Although an example of using the insulating film 8 has been described in the first embodiment, an example of using a photosensitive insulating film instead of the insulating film 8 will be described in the third embodiment. The manufacturing method of a semiconductor chip in the third embodiment will be described below.

Figure 38:
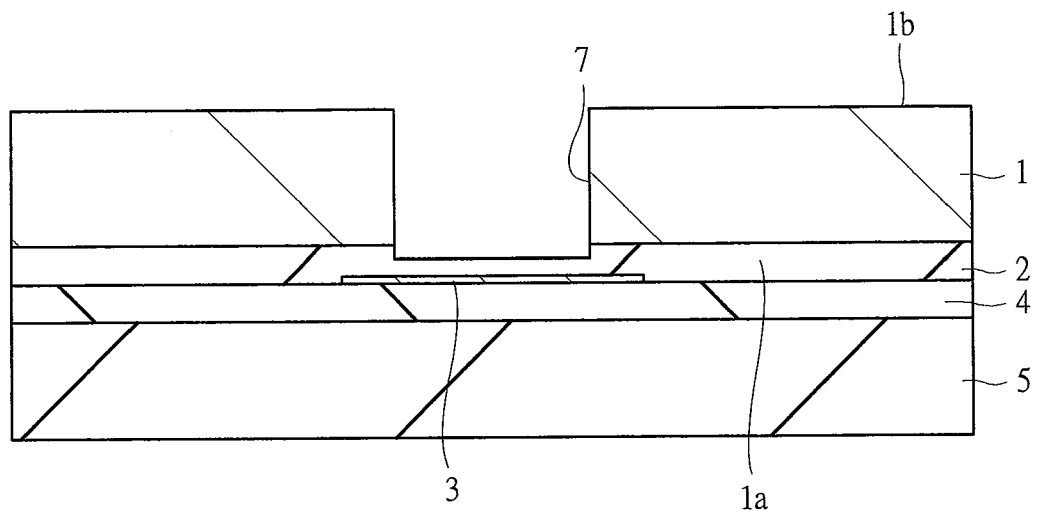
FIG. 38 is a cross-sectional view showing a manufacturing process of a semiconductor device in the third embodiment.

By performing the process shown from FIG. 3 to FIG. 7, the first hole 7 which reaches the interlayer insulating film 2 from the second surface 1b of the semiconductor substrate 1 is formed. Then, as shown in FIG. 38, after removing the resist film 6, the interlayer insulating film 2 exposed on the bottom surface of the first hole 7 is etched to the middle with using the semiconductor substrate 1 made of silicon and the first hole 7 formed in the semiconductor substrate 1 as a mask.

Figure 39:
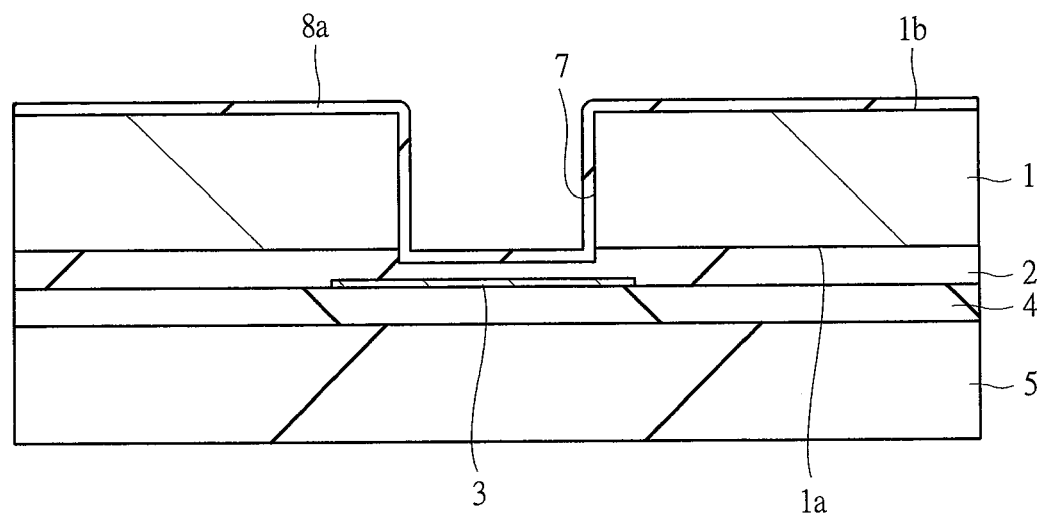
FIG. 39 is a cross-sectional view showing the manufacturing process of a semiconductor device continued from FIG. 38.

Then, as shown in FIG. 39, a photosensitive insulating film 8a is formed on the second surface 1b of the semiconductor substrate 1 including the inside of the first hole 7. The photosensitive insulating film 8a is formed along the bottom surface and the side surface of the first hole 7 and the second surface 1b of the semiconductor substrate 1 so as to cover these surfaces. The photosensitive insulating film 8a has a function to insulate the through silicon via described below and the semiconductor substrate 1.

Figure 40:
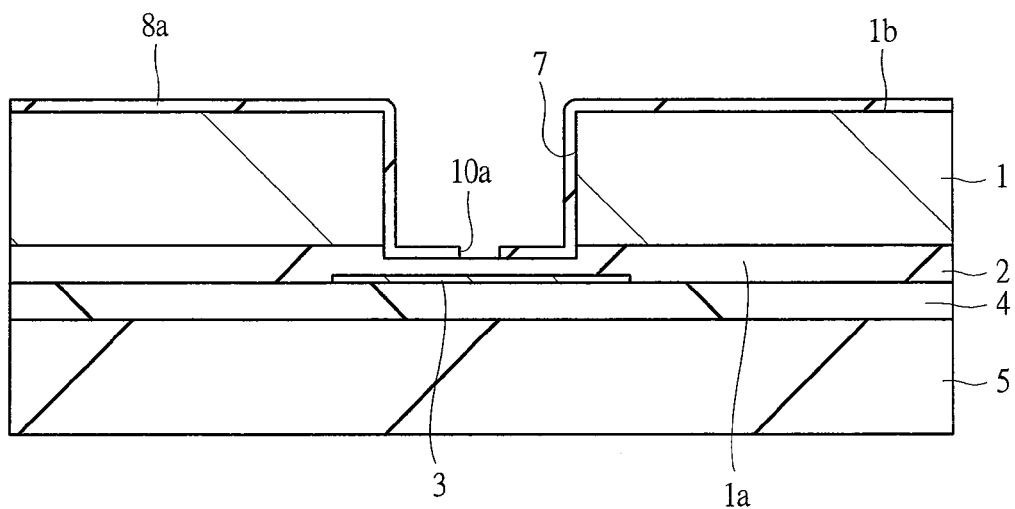
FIG. 40 is a cross-sectional view showing the manufacturing process of a semiconductor device continued from FIG. 39.

Subsequently, as shown in FIG. 40, the photosensitive insulating film 8a is patterned by using the photolithography technology. The photosensitive insulating film 8a is patterned so as to form an opening 10a in the bottom surface of the first hole 7. As the exposure apparatus for the photolithography process, a stepper apparatus or a laser exposure apparatus is used.

Figure 41:
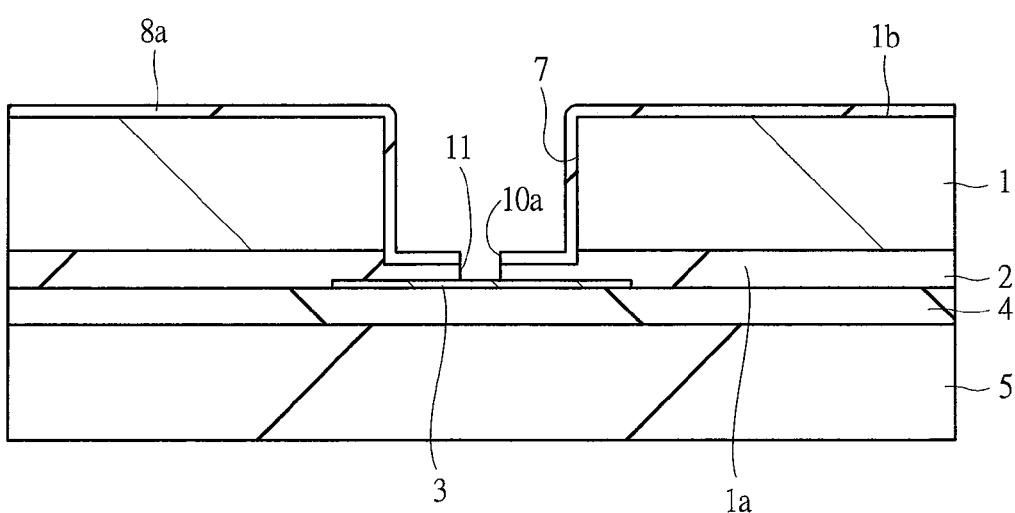
FIG. 41 is a cross-sectional view showing the manufacturing process of a semiconductor device continued from FIG. 40.

Thereafter, as shown in FIG. 41, the interlayer insulating film 2 exposed from the opening 10a is all removed by etching. By doing so, the second hole 11 having the diameter smaller than that of the first hole 7 can be formed in the bottom surface of the first hole 7. The pad 3 is exposed on the bottom surface of the second hole 11.

Here, in the third embodiment, the thickness of the interlayer insulating film 2 between the bottom surface of the first hole 7 and the pad 3 is reduced by forming the first hole 7 to the middle of the interlayer insulating film 2 as shown in FIG. 38. Therefore, when the second hole 11 reaching the pad 3 from the bottom surface of the first hole 7 is to be formed, the second hole 11 reaching the pad 3 can be formed with using a mask of the photosensitive insulating film 8a only once. In other words, the thickness of the interlayer insulating film 2 remaining between the bottom of the first hole 7 and the pad 3 can be set to the thickness capable of forming the second hole 11 before the photosensitive insulating film 8a used as a mask disappears when forming the second hole 11.

Thereafter, by performing the process shown in FIG. 17 to FIG. 25, the semiconductor chip in the third embodiment can be manufactured.

The feature of the third embodiment lies in using the photosensitive insulating film 8a. In the first embodiment, after forming the insulating film 8 and the aluminum film 9 in the first hole 7, the resist film 10 is formed on the aluminum film 9. Then, after forming the opening 10a in the resist film 10, the aluminum film 9, the insulating film 8 and the interlayer insulating film 2 exposed from the opening 10a are etched, thereby forming the second hole 11 reaching the pad 3 from the bottom surface of the first hole 7. Here, the insulating film 8 has a function to insulate the through silicon via 17 and the semiconductor substrate 1, and the resist film 10 has a function to form the opening 10a. Thus, in the third embodiment, the photosensitive insulating film 8a is used as a film having both the functions of the insulating film 8 and the resist film 10. Although the processes of forming the insulating film 8 and the resist film 10 are necessary in the first embodiment, these processes can be replaced with the process of forming the photosensitive insulating film 8a in the third embodiment. More specifically, according to the third embodiment, the manufacturing process of a semiconductor chip can be simplified. The advantage that the process can be simplified by using the photosensitive insulating film 8a can be achieved by the combined use with the process of reducing the thickness of the interlayer insulating film 2 between the bottom surface of the first hole 7 and the pad 3, which is one of the features of the present invention.

In other words, although etching resistance of the photosensitive insulating film 8a is low, since the thickness of the interlayer insulating film 2 between the bottom surface of the first hole 7 and the pad 3 is reduced, the second hole 11 can be formed in the interlayer insulating film 2 before the photosensitive insulating film 8a disappears.

The photosensitive insulating film 8a is the film used instead of the insulating film 8 and is required to remain on the semiconductor substrate 1 even after forming the second hole 11. In other words, it is necessary that the photosensitive insulating film 8a does not disappear by the etching of the interlayer insulating film 2 using the photosensitive insulating film 8a as a mask. Considering this point, by adding the process of reducing the thickness of the interlayer insulating film 2 between the bottom surface of the first hole 7 and the pad 3, which is one of the features of the present invention, the usability of the photosensitive insulating film 8a arises. For example, when the photosensitive insulating film 8a is used to simplify the process, if the process of reducing the thickness of the interlayer insulating film 2 between the bottom surface of the first hole 7 and the pad 3, which is one of the features of the present invention is not performed, the thick interlayer insulating film 2 have to be etched and the photosensitive insulating film 8a with the low etching resistance disappears during the etching of the thick interlayer insulating film 2, and the advantage of using the photosensitive insulating film 8a is lost.

As is evident from above, the effect of the simplification of the process obtained by using the photosensitive insulating film 8a can be achieved by performing the process of reducing the thickness of the interlayer insulating film 2 between the bottom surface of the first hole 7 and the pad 3, which is one of the features of the present invention. Further, the advantage obtained by using the photosensitive insulating film 8a lies in that the second hole 11 can be formed by etching only the interlayer insulating film 2. More specifically, in the case of the first embodiment, it is necessary to etch the combined film of the insulating film 8 and the interlayer insulating film 2 present below the resist film 10, but in the third embodiment, since the photosensitive insulating film 8a itself serves as a mask, the second hole 11 can be formed by etching only the interlayer insulating film 2 formed below the photosensitive insulating film 8a. Thus, since the thickness of the film to be removed when processing the second hole 11 is reduced, the process of the second hole 11 can be further facilitated. Note that the same effect as that of the first embodiment can be achieved also in the third embodiment.

Fourth Embodiment

In the fourth embodiment, a semiconductor device of the SiP structure in which semiconductor chips manufactured in the first to third embodiments are three-dimensionally stacked will be described.

Figure 42:
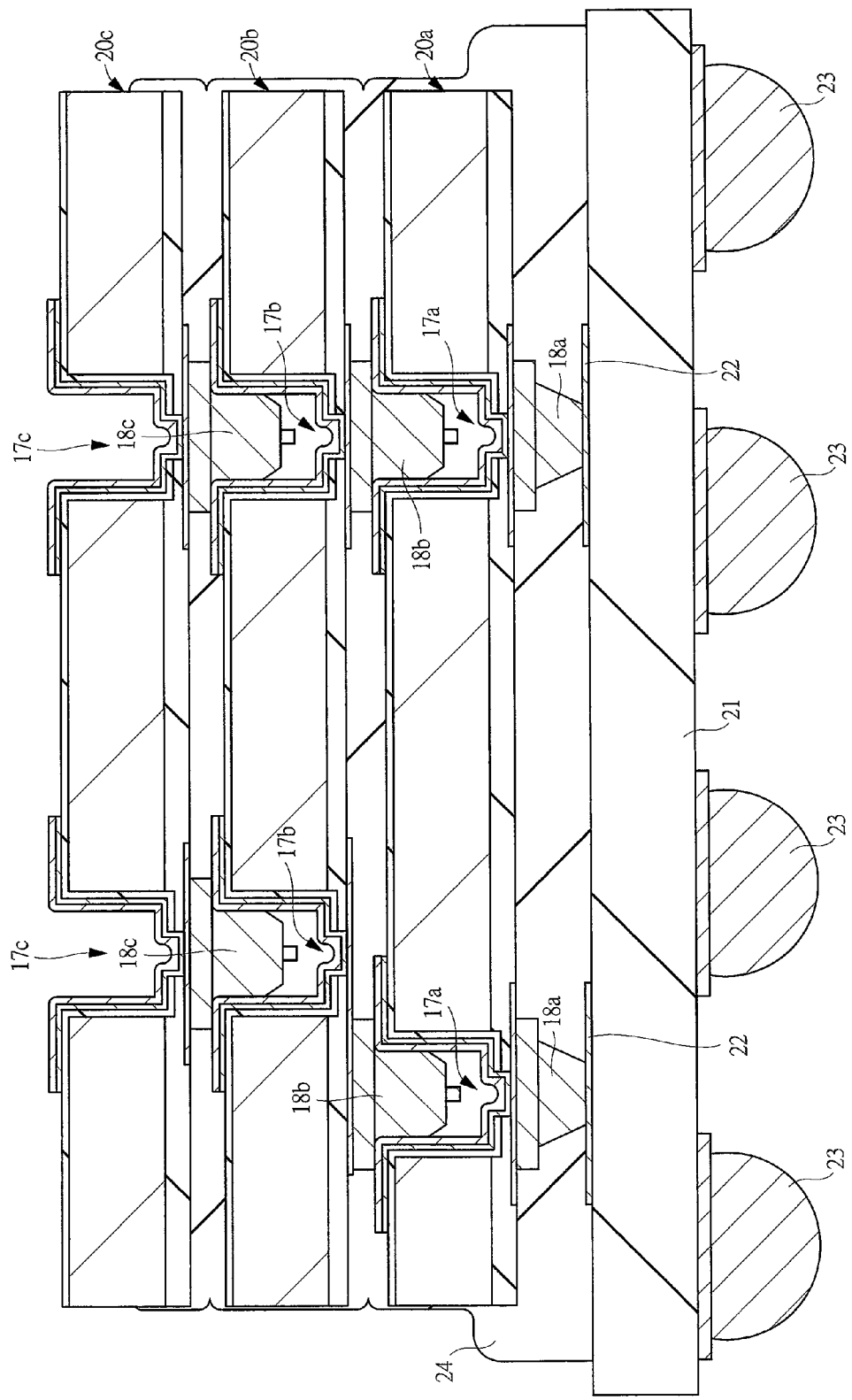
FIG. 42 is a cross-sectional view showing a semiconductor device in the fourth embodiment.

FIG. 42 is a cross-sectional view showing the semiconductor device in the fourth embodiment. As shown in FIG. 42, for example, a semiconductor chip 20a constituted of a microcomputer chip and a semiconductor chip 20c constituted of an SDRAM are three-dimensionally stacked via a semiconductor chip 20b serving as an interposer chip for rewiring. Also, the stacked three semiconductor chips 20a to 20c are mounted on a wiring board 21.

The semiconductor chip 20a constituted of a microcomputer chip is a semiconductor chip in which a highly integrated circuit is formed, and a through silicon via 17a and a stud bump electrode 18a are formed therein. Similarly, the semiconductor chip 20c constituted of an SDRAM is a semiconductor chip in which a highly integrated circuit is formed, and a through silicon via 17c and a stud bump electrode 18c are formed therein. On the other hand, the semiconductor chip 20b is an interposer chip, and a through silicon via 17b and a stud bump electrode 18b are formed therein. Further, the semiconductor chip 20a is mounted on the wiring board 21 so that the stud bump electrode 18a formed in the semiconductor chip 20a and the electrode 22 formed on the wiring board 21 are electrically connected to each other. Furthermore, the semiconductor chip 20b is mounted on the semiconductor chip 20a. At this time, the electrical connection between the semiconductor chip 20a and the semiconductor chip 20b is made by inserting the stud bump electrode 18b formed in the semiconductor chip 20b into the through silicon via 17a formed in the semiconductor chip 20a. Further, the semiconductor chip 20c is mounted on the semiconductor chip 20b. Furthermore, the electrical connection between the semiconductor chip 20b and the semiconductor chip 20c is made by inserting the stud bump electrode 18c formed in the semiconductor chip 20c into the through silicon via 17b formed in the semiconductor chip 20b.

Solder bump electrodes 23 are formed on the surface of the wiring board 21 opposite to the surface on which the semiconductor chips 20a to 20c are mounted. The solder bump electrode 23 is electrically connected to the electrode 22 through the inside of the wiring board. The solder bump electrode 23 has a function as an external terminal to be electrically connected to the outside of the semiconductor device.

Further, sealing adhesive 24 for filling the spaces between the wiring board 21 and the semiconductor chips 20a to 20c. The sealing adhesive 24 has a function to improve the mechanical strength of the semiconductor device and the handling ability in the assembly process of the semiconductor device and also a function to protect the semiconductor device from the external environment.

The semiconductor device in the fourth embodiment has the structure as described above, and the method of stacking the semiconductor chips 20a to 20c will be described below.

For example, a first semiconductor wafer is used as a semiconductor substrate, and the through silicon via 17a (first through silicon via) to be electrically connected to the first pad formed in each chip region of the first semiconductor wafer is formed by performing the processes described in the first embodiment to each chip region in the first semiconductor wafer. Thereafter, the first semiconductor wafer is diced into pieces of plural semiconductor chips, thereby acquiring the semiconductor chips 20a (first semiconductor chip). Then, in the semiconductor chip 20a, the stud bump electrode 18a is formed on the first pad on the side opposite to the side connected to the through silicon via 17a.

Similarly, a second semiconductor wafer is used as a semiconductor substrate, and the through silicon via 17b (second through silicon via) to be electrically connected to the second pad formed in each chip region of the second semiconductor wafer is formed by performing the processes described in the second embodiment to each chip region in the second semiconductor wafer. Thereafter, the second semiconductor wafer is diced into pieces of plural semiconductor chips, thereby acquiring the semiconductor chips 20b (second semiconductor chip). Then, in the semiconductor chip 20b, the stud bump electrode 18b is formed on the second pad on the side opposite to the side connected to the through silicon via 17b.

Subsequently, the semiconductor chip 20b is stacked on the semiconductor chip 20a, so that they are electrically connected to each other. In this process, the stud bump electrode 18b formed in the semiconductor chip 20b is deformed and inserted by pressure welding to the through silicon via 17a formed in the semiconductor chip 20a. As described above, the semiconductor device can be formed by respectively forming the semiconductor chip 20a and the semiconductor chip 20b and then stacking the semiconductor chips 20a and 20b. Note that the semiconductor chip 20c can be stacked on the semiconductor chip 20b in the same manner.

Next, another method of stacking the semiconductor chips 20a to 20c will be described. For example, after the through silicon via 17a to be electrically connected to the first pad formed in each chip region of the first semiconductor wafer is formed by performing the processes described in the first embodiment to each chip region in the first semiconductor wafer, the stud bump electrode 18a is formed on the first pad on the side opposite to the side connected to the through silicon via 17*a*. As described above, the stud bump electrode 18*a* can be formed also in a state of a semiconductor wafer.

Similarly, after the through silicon via 17*b* to be electrically connected to the second pad formed in each chip region of the second semiconductor wafer is formed by performing the processes described in the second embodiment to each chip region in the second semiconductor wafer, the stud bump electrode 18*b* is formed on the second pad on the side opposite to the side connected to the through silicon via 17*b*.

Thereafter, the second semiconductor wafer is stacked on the first semiconductor wafer, so that they are electrically connected to each other. In this process, the stud bump electrode 18*b* formed in the second semiconductor wafer is deformed and inserted by pressure welding to the through silicon via 17*a* formed in the first semiconductor wafer. As described above, the stacking can be achieved also in a state of a semiconductor wafer.

Next, the first semiconductor wafer and the second semiconductor wafer in a stacked state are diced into pieces of plural semiconductor chips. By this means, the stacked structure of the semiconductor chip 20*a* and the semiconductor chip 20*b* can be obtained. Note that the semiconductor chip 20*c* can be stacked on the semiconductor chip 20*b* in the same manner.

In the foregoing, the invention made by the inventors of the present invention has been concretely described based on the embodiments. However, it is needless to say that the present invention is not limited to the foregoing embodiments and various modifications and alterations can be made within the scope of the present invention.

Finally, Patent Document 4 (Japanese Patent Application Laid-Open Publication No. 2005-93486) and the present invention are compared. Patent Document 4 and the present invention seem similar to each other in the point that the through silicon via is formed of a first hole and a second hole with a diameter smaller than that of the first hole and in the point that an interlayer insulating film exposed on the bottom surface of the first hole is etched. However, in Patent Document 4, the through silicon via is completely filled with a conductive film, but the through silicon via has a hollow therein in the present invention. This difference is a significant difference. More specifically, in the present invention, the structure in which a plurality of semiconductor chips are stacked by deforming and inserting the stud bump electrode into the through silicon via is adopted. Therefore, the space to which the stud bump electrode is to be inserted is required in the through silicon via. Thus, the first hole to which the stud bump electrode is inserted is formed in the through silicon via. At this time, it is also possible to form the first hole which reaches the pad from the through silicon via. However, when the first hole with a large diameter is formed so as to reach the pad, the interlayer insulating film supporting the pad is removed, and the strength of the pad surfaces is obviously decreased. Therefore, in the present invention, the first hole is formed to the middle of the semiconductor substrate, and the second hole with a diameter smaller than that of the first hole is formed as a hole that reaches the pad from the bottom surface of the first hole. In this manner, the interlayer insulating film can sufficiently remain around the second hole, and the decrease in strength of the pad can be prevented. As described above, the technical idea of forming the through silicon via from the first hole and the second hole is effective for solving the problem of the decrease in pad strength due to that the through silicon via has a hollow therein. Further, the problem of the decrease in pad strength occurs when a stud bump electrode is formed on a pad. More specifically, the structure of the present invention is based on the structure in which a stud bump electrode is formed on a pad.

On the other hand, in Patent Document 4, the through silicon via is formed from a first hole and a second hole with a diameter smaller than that of the first hole, but an interior of the through silicon via is filled with a conductive film. Thus, since the strength of the pad is supported by the conductive film filled in the through silicon via, the problem of the decrease in strength of the pad does not occur in the first place. Further, since a stud bump electrode is not formed on a pad in the structure of Patent Document 4, the problem of the strength of the pad does not occur. More specifically, although the through silicon via is formed from the first hole and the second hole with a diameter smaller than that of the first hole, the purpose and effect thereof are not suggested and proposed in Patent Document 4. In Patent Document 4, since an insulating film is formed on a side surface of the first hole and the second hole is then processed, it is thought that the diameter of the second hole is merely reduced by the thickness of the insulating film formed on the side surface of the first hole. More specifically, in the present invention, the second hole with a diameter smaller than that of the first hole is intentionally formed as a hole reaching the pad from the bottom surface of the first hole regardless of the thickness of the insulating film formed on the side surface of the first hole. Accordingly, it is evident that Patent Document 4 does not include any description to be the motivation capable of easily reaching the present invention.

Subsequently, the feature of the present invention lies in that the thickness of the interlayer insulating film is controlled to be intentionally reduced by etching the interlayer insulating film exposed on the bottom surface of the first hole. By controlling the thickness of the interlayer insulating film between the first hole and the pad to be reduced in this manner, the process of the second hole formed by etching the interlayer insulating film can be facilitated, and the reliability for forming the second hole can be improved.

On the other hand, Patent Document 4 is similar to the present invention in that the interlayer insulating film exposed on the bottom surface of the first hole is etched. However, in Patent Document 4, the interlayer insulating film exposed on the bottom surface of the first hole is incidentally etched when removing a hard mask used to form the first hole. More specifically, Patent Document 4 does not describe and suggest any technical idea of controlling the thickness of the interlayer insulating film by intentionally etching the interlayer insulating film exposed on the bottom surface of the first hole, and it is evident that Patent Document 4 does not include any description to be the motivation capable of easily reaching the present invention.

As described above, although Patent Document 4 seemingly discloses the structure similar to that of the present invention, it can be found from the detailed examination that the technical idea of Patent Document 4 is completely different from that of the present invention and Patent Document 4 does not include any description to be the motivation capable of easily reaching the present invention. Therefore, it is difficult to easily reach the present invention from the description of Patent Document 4 even by those skilled in the art.

The present invention can be widely applied to the manufacturing industry of a semiconductor device.

What is claimed is:

1. A semiconductor device in which a first through silicon via of a first semiconductor chip having a semiconductor substrate and a second through silicon via of a second semiconductor chip having a semiconductor substrate are electrically connected to each other, the semiconductor device comprising:

an interlayer insulating film formed on a first surface of the first semiconductor chip;

a pad formed on the interlayer insulating film; and a bump electrode formed on the pad;

wherein the first through silicon via reaches the pad from a second surface of the first semiconductor chip on a side opposite to the first surface, wherein the first through silicon via includes:

a first hole which reaches the interlayer insulating film from the second surface of the first semiconductor chip on a side opposite to the first surface and whose bottom surface is formed at a position closer to the pad than to an interface between the interlayer insulating film and the semiconductor substrate;

a second hole whose diameter is smaller than a diameter of the first hole and which is formed to reach the pad from the bottom surface of the first hole;

an insulating film formed on bottom and side surfaces of the first hole and on the second surface of the semiconductor substrate; and a conductive film which is formed on bottom and side surfaces of the second hole, on the bottom and side surfaces of the first hole via the insulating film and on the second surface of the semiconductor substrate and is electrically connected to the pad, wherein the first through silicon via of the first semiconductor chip and the second through silicon via of the second semiconductor chip are electrically connected to each other through the bump electrode formed on an upper surface of the pad, wherein a surface of the interlayer insulating film on a side of the semiconductor substrate has a step shape reflecting a step difference between the bottom surface of the first hole and the first surface of the semiconductor substrate.

2. The semiconductor device according to claim 1, wherein a surface of the conductive film has a step shape reflecting a step difference between the second surface of the semiconductor substrate and the bottom surface of the first hole.

3. The semiconductor device according to claim 1, wherein the first through silicon via and the second through silicon via each have a respective hollow portion.

4. The semiconductor device according to claim 3, wherein the bump electrode is inserted into the second through silicon via of the second semiconductor chip and then mechanically caulked.

5. The semiconductor device according to claim 1, wherein, when the first through silicon via is seen from a side of the second surface of the semiconductor substrate, the first through silicon via forms double rings in a planar shape including a ring of the first hole and a ring of the second hole with a diameter smaller than that of the first hole.

6. The semiconductor device according to claim 1, wherein, when a thickness of the conductive film formed on the pad which is the bottom surface of the second hole is defined as 'A' and a combined thickness of the interlayer insulating film formed between the bottom surface of the first hole and the pad and the insulating film formed on the bottom surface of the first hole is defined as 'B', a value of A/(A+B) is 0.11 or more.

7. The semiconductor device according to claim 1, wherein the first through silicon via of the first semiconductor chip and the second through silicon via of the second semiconductor chip are electrically connected by mechanically caulking the bump electrode.

8. The semiconductor device according to claim 1, wherein the first semiconductor chip has the bump electrode on a surface opposite to the first through silicon via.

* * * * *